(12) United States Patent
Jeong et al.

(10) Patent No.: US 9,054,051 B2
(45) Date of Patent: Jun. 9, 2015

(54) METHOD OF FABRICATING SEMICONDUCTOR DEVICE

(75) Inventors: Soo-yeon Jeong, Hwaseong-si (KR); In-ho Kim, Suwon-si (KR); Hyung-yong Kim, Cheongju-si (KR); Myeong-cheol Kim, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 13/473,091

(22) Filed: May 16, 2012

(65) Prior Publication Data

US 2012/0322224 A1     Dec. 20, 2012

(30) Foreign Application Priority Data

Jun. 15, 2011    (KR) .................. 10-2011-0057973

(51) Int. Cl.
| | |
|---|---|
| H01L 21/311 | (2006.01) |
| H01L 27/102 | (2006.01) |
| H01L 49/02 | (2006.01) |
| H01L 45/00 | (2006.01) |
| H01L 27/24 | (2006.01) |
| H01L 21/768 | (2006.01) |

(52) U.S. Cl.
CPC ...... *H01L 21/31144* (2013.01); *H01L 27/1021* (2013.01); *H01L 28/91* (2013.01); *H01L 45/06* (2013.01); *H01L 45/1233* (2013.01); *H01L 45/1683* (2013.01); *H01L 27/2409* (2013.01); *H01L 21/76898* (2013.01); *H01L 21/76816* (2013.01)

(58) Field of Classification Search
USPC .......... 438/382, 702, 717, 703; 257/E21.257, 257/E47.005
See application file for complete search history.

(56) References Cited

U.S. PATENT DOCUMENTS

| | | | |
|---|---|---|---|
| 2007/0184613 A1* | 8/2007 | Kim et al. ..................... 438/257 |
| 2008/0131793 A1* | 6/2008 | Lee et al. ........................... 430/5 |
| 2008/0220611 A1* | 9/2008 | Jeon et al. ..................... 438/694 |
| 2010/0187611 A1* | 7/2010 | Schiwon et al. .............. 257/369 |
| 2010/0248491 A1* | 9/2010 | Sun et al. ...................... 438/717 |
| 2010/0330500 A1* | 12/2010 | Bae et al. ................... 430/270.1 |

FOREIGN PATENT DOCUMENTS

| | | |
|---|---|---|
| JP | 06333886 | 12/1994 |
| KR | 100652795 | 11/2006 |
| KR | 1020100109159 | 10/2010 |

* cited by examiner

*Primary Examiner* — Christine Enad
(74) *Attorney, Agent, or Firm* — Onello & Mello LLP

(57) ABSTRACT

In a method of fabricating a semiconductor device, a target layer and a first material layer are sequentially formed on a substrate. A plurality of second material layer patterns are formed on the first material layer, the second material layer patterns extending in a first horizontal direction. A plurality of hardmask patterns extending in a second horizontal direction are formed on the plurality of second material layer patterns and the first material layer, wherein the second horizontal direction is different from the first horizontal direction. A first material layer pattern is formed by etching the first material layer using the plurality of hardmask patterns and the plurality of second material layer patterns as etch masks. A target layer pattern with a plurality of holes is formed by etching the target layer using the first material layer pattern as an etch mask.

20 Claims, 35 Drawing Sheets

METHOD OF FABRICATING SEMICONDUCTOR DEVICE

CROSS-REFERENCE TO RELATED APPLICATIONS

This application claims the benefit of Korean Patent Application No. 10-2011-0057973, filed on Jun. 15, 2011, in the Korean Intellectual Property Office, the disclosure of which is incorporated herein in its entirety by reference.

BACKGROUND

One or more aspects of the inventive concept relate to a method of fabricating a semiconductor device, and more particularly, to a method of fabricating a semiconductor device with openings or holes used for various components or structures of the device. Electronic products continue to become further reduced in size, while the demands for processing ever-higher amounts of data continue to increase. Thus, the integration degree of semiconductor devices for use in electronic products continues to increase. With increased integration, the challenges for performing fine manufacturing processes for semiconductor devices also increase.

SUMMARY

One or more aspects of the inventive concept provide a method of fabricating a semiconductor device with holes in a manner that is consistent with an increased integration of the semiconductor device.

In one aspect, a method of fabricating a semiconductor device, the method comprises: sequentially forming a target layer and a first material layer on a substrate; forming a plurality of second material layer patterns on the first material layer, the second material layer patterns extending in a first horizontal direction; forming a plurality of hardmask patterns extending in a second horizontal direction, on the plurality of second material layer patterns and the first material layer, wherein the second horizontal direction is different from the first horizontal direction; forming a first material layer pattern by etching the first material layer using the plurality of hardmask patterns and the plurality of second material layer patterns as etch masks; and forming a target layer pattern with a plurality of holes by etching the target layer using the first material layer pattern as an etch mask.

In some embodiments, before the forming of the target layer pattern, the method further comprises removing the plurality of hardmask patterns.

In some embodiments, the plurality of hardmask patterns comprise a carbon-containing layer; the first material layer comprises nitride; and each of the plurality of second material layer patterns comprises an oxide.

In some embodiments, the plurality of hardmask patterns comprise a spin-on hardmask (SOH), and the first material layer comprises titanium nitride.

In some embodiments, the forming of the first material layer pattern comprises etching the first material layer using an etch gas containing a chlorine gas.

In some embodiments, the target layer comprises an oxide, and the forming of the target layer pattern comprises etching the target layer by using an etch gas containing a fluorocarbon gas.

In some embodiments, the forming of the plurality of second material layer patterns comprises: forming a second material layer on the first material layer; forming a plurality of additional hardmask patterns extending in the first horizontal direction, on the second material layer; and forming the plurality of second material layer patterns by etching the second material layer using the plurality of additional hardmask patterns as etch masks.

In some embodiments, the first material layer pattern is formed to correspond to locations on which either the plurality of hardmask patterns or the plurality of additional hardmask patterns are formed, and the plurality of holes are formed to correspond to locations on which neither the plurality of hardmask patterns nor the plurality of additional hardmask patterns are formed.

In some embodiments, the first horizontal direction and the second horizontal direction are perpendicular to each other.

In some embodiments, after the forming of the target layer pattern with the plurality of holes, the method further comprises filling the plurality of holes with a conductive material.

In some embodiments, the method further comprises forming a plurality of active regions in the substrate, wherein at least one of the plurality of holes corresponds to each of the plurality of active regions.

In some embodiments, after the forming of the target layer pattern with the plurality of holes, the method further comprises forming a conductive plug in the plurality of holes.

In some embodiments, after the forming of the target layer pattern with the plurality of holes, the method further comprises: forming a first semiconductor material plug of a first conductive type and a second semiconductor material plug of a second conductive type in the plurality of holes, respectively, wherein the second conductive type is different from the first conductive type; and forming a phase-change material layer on the second semiconductor material plug.

In some embodiments, after the forming of the target layer pattern with the plurality of holes, the method further comprises respectively forming at least one from among a lower electrode layer, a capacitor dielectric layer, and an upper electrode layer that form a capacitor together, in the plurality of holes.

In another aspect, a method of fabricating a semiconductor device comprises: sequentially forming a target layer, a titanium nitride layer, and an oxide layer on a substrate; forming a plurality of first hardmask patterns on the oxide layer, the plurality of first hardmask patterns extending in a first horizontal direction, spaced apart from each other, and each including a spin-on hardmask (SOH); forming an oxide layer pattern by etching the oxide layer using the plurality of first hardmask patterns as etch masks; forming a plurality of second hardmask patterns on the oxide layer pattern and the titanium nitride layer, the plurality of second hardmask patterns extending in a second horizontal direction that is different from the first horizontal direction, spaced apart from each other, and each including an SOH; forming a titanium nitride layer pattern by etching the titanium nitride layer by using the plurality of second hardmask patterns and the oxide layer pattern as etch masks, while preventing a carbon-containing polymer from being formed on the plurality of second hardmask patterns, by using an etch gas containing a chlorine gas; and forming a target layer pattern with a plurality of holes by etching the target layer by using the titanium nitride layer pattern as an etch mask.

In another aspect, a method of fabricating a semiconductor device comprises: forming a target layer on a substrate; forming a first material layer directly on the target layer; forming a plurality of second material layer patterns on the first material layer, the second material layer patterns extending in a first horizontal direction; prior to etching the first material layer, forming a plurality of hardmask patterns extending in a second horizontal direction, on the plurality of second material layer patterns and the first material layer, wherein the second horizontal direction is different from the first horizontal direction; after forming the plurality of second material layer patterns and the plurality of hardmask patterns, forming a first material layer pattern by etching the first material layer using the plurality of hardmask patterns and the plurality of second material layer patterns as etch masks; and after forming the first material layer pattern, forming a target layer pattern with a plurality of holes by etching the target layer using the first material layer pattern as an etch mask.

In some embodiments, before forming the target layer pattern, the method further comprises removing the plurality of hardmask patterns.

In some embodiments, before forming the target layer pattern, the method further comprises removing the plurality of second material layer patterns.

In some embodiments, the plurality of hardmask patterns comprise a carbon-containing layer.

In some embodiments, the method further comprises, following forming the target layer pattern, removing the first material layer pattern and applying a fill material to the plurality of holes.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION OF EMBODIMENTS

Figure 1A:
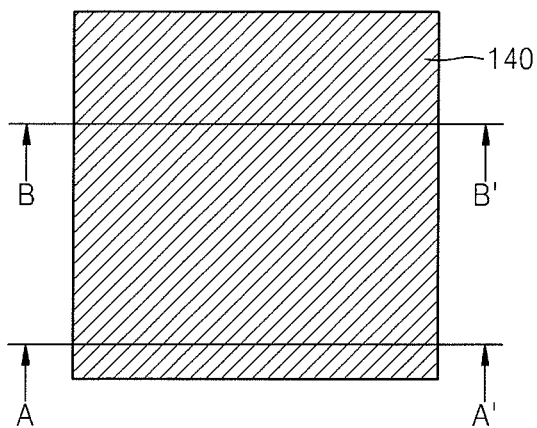
FIGS. 1A to 11C are plane and cross-sectional views of a method of fabricating a semiconductor device, according to an embodiment of the inventive concept.

Exemplary embodiments of the inventive concepts will now be described in greater detail with reference to the accompanying drawings, in which exemplary embodiments of the inventive concept are shown. Exemplary embodiments of the inventive concept may, however, be embodied in many different forms and should not be construed as limited to the embodiments set forth herein; rather, these exemplary embodiments of the inventive concept are provided so that this description will be thorough and complete, and will fully convey the concept of exemplary embodiments of the inventive concept to those of ordinary skill in the art. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated, for example, 90 degrees or at other orientations) and the spatially relative descriptors used herein interpreted accordingly.

The terminology used herein is for the purpose of describing particular exemplary embodiments of the inventive concept only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the inventive concept are described herein with reference to cross-sectional illustrations that are schematic illustrations of idealized exemplary embodiments of the inventive concept (and intermediate structures). As such, variations from the shapes of the illustrations as a result, for example, of manufacturing techniques and/or tolerances, are to be expected. Thus, exemplary embodiments of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1A to 11C are plane and cross-sectional views of a method of fabricating a semiconductor device, according to an embodiment of the inventive concept. Specifically, FIGS. 1A, 2A, 3A, 4A, 5A, 6A, 7A, 8A, 9A, 10A, and 11A are plan views illustrating a process of manufacturing a semiconductor device, according to an embodiment of the inventive concept. FIGS. 1B, 2B, 3B, 4B, 5B, 6B, 7B, 8B, 9B, 10B, and 11B are cross-sectional views taken along the lines A-A' and B-B' of FIGS. 1A, 2A, 3A, 4A, 5A, 6A, 7A, 8A, 9A, 10A, and 11A, respectively. FIGS. 5C, 6C, 7C, 8C, 9C, 10C, and 11C are cross-sectional views taken along the lines C-C' and D-D' of FIGS. 5A, 6A, 7A, 8A, 9A, 10A, and 11A, respectively.

Figure 1B:
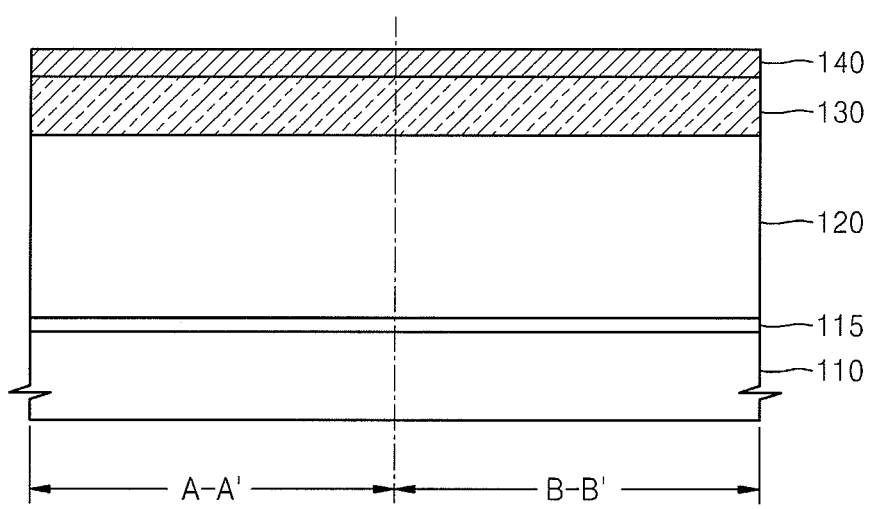

FIGS. 1A and 1B are plane and cross-sectional views illustrating forming a target layer 120, a first material layer 130, and a second material layer 140, according to an embodiment of the inventive concept. Referring to FIGS. 1A and 1B, the target layer 120, the first material layer 130, and the second material layer 140 are sequentially formed on a substrate 110. An etch stop layer 115 may optionally be formed between the substrate 110 and the target layer 120.

The substrate 110 may include a semiconductor material, e.g., a Group IV semiconductor, a Group III-V compound semiconductor, or a Group II-VI oxide semiconductor. For example, the Group IV semiconductor may comprise silicon, germanium, or silicon-germanium. The substrate 110 may comprise a bulk wafer or an epitaxial layer. Alternatively, the substrate 110 may comprise a silicon-on-insulator (SOI) substrate, a gallium-arsenic substrate, a silicon-germanium substrate, a ceramic substrate, a quartz substrate, or a glass substrate for a display device, or another suitable substrate material. Unit devices (not shown), e.g., various types of active or passive devices, which are required to form the components of a semiconductor device, may be formed on the substrate 110. Also, isolation layers (not shown) for isolating the unit devices from each other may be formed on the substrate 110. The isolation layers may be obtained, for example, according to a local oxidation of silicon (LOCOS) process or a shallow trench isolation (STI) process. An insulating interlayer (not shown), covering the unit devices, may be provided on the substrate 110. Conductive regions (not shown) may further be provided on the substrate 110 to be electrically connected to the unit devices via the insulating interlayer. Also, conductive lines (not shown) may be formed to connect the unit devices or the conductive regions. Various structures of the substrate 110 will be described in detail herein.

The target layer 120 may be etched to form holes therein in a subsequent process described herein. Throughout the present specification, the holes may be contact holes for connecting upper and lower elements of the semiconductor device, isolation patterns formed on the substrate of the semiconductor device, spaces for forming capacitors of the semiconductor device, trench patterns of the semiconductor device, or through-silicon vias for use in a semiconductor package, and the inventive concept is not limited to the shapes and sizes of the holes.

The target layer 120 may comprise, for example, an oxide, such as a silicon oxide layer. However, the inventive concept is not limited thereto, and a material used to form the target layer 120 is not limited to the oxide and thus the target layer 120 may be formed of at least one of various other materials. For example, the target layer 120 may optionally be formed of nitride, e.g., silicon nitride.

The etch stop layer 115 may be used to prevent over-etching that partially etches the substrate 110, when the target layer 120 is etched to form the holes therein. In some embodiments, the etch stop layer 115 may be formed of, for example, nitride. The etch stop layer 115 is not particularly needed in a case where the substrate 110 has a high etch selectivity with respect to the target layer 120.

The first material layer 130 may be formed of a material having an etch selectivity with respect to the target layer 120. The first material layer 130 may be formed of, for example, titanium nitride (TiN). However, the inventive concept is not limited thereto and the first material layer 130 may be formed of at least one of other various materials. A portion of the first material layer 130 may be used as an etch mask for etching the target layer 120 in a subsequent process described herein.

In some embodiments, the second material layer 140 may be formed of a material having an etch selectivity with respect to the first material layer 130. The second material layer 140 may be formed of, for example, an oxide such as a silicon oxide. However, the inventive concept is not limited thereto, and the second material layer 140 may be formed of at least one of other various materials. A portion of the second material layer 140 may be used as an etch mask for etching the first material layer 130 in a subsequent process described below. In some embodiments, the thickness of the second material layer 140 may be far less than that of the target layer 120. In some embodiments, the second material layer 140 may have a thickness of less than 20% of that of the target layer 120.

Figure 2A:
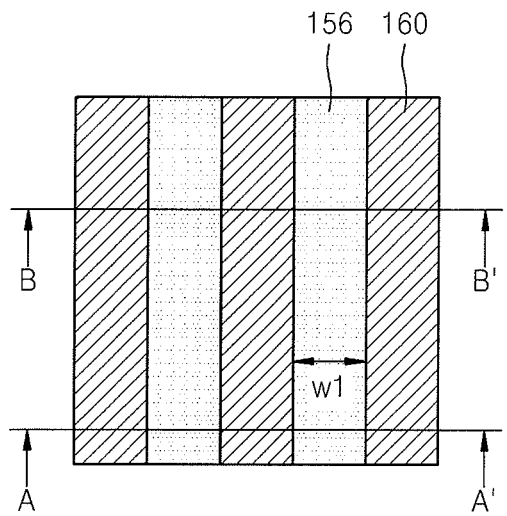
Figure 2B:
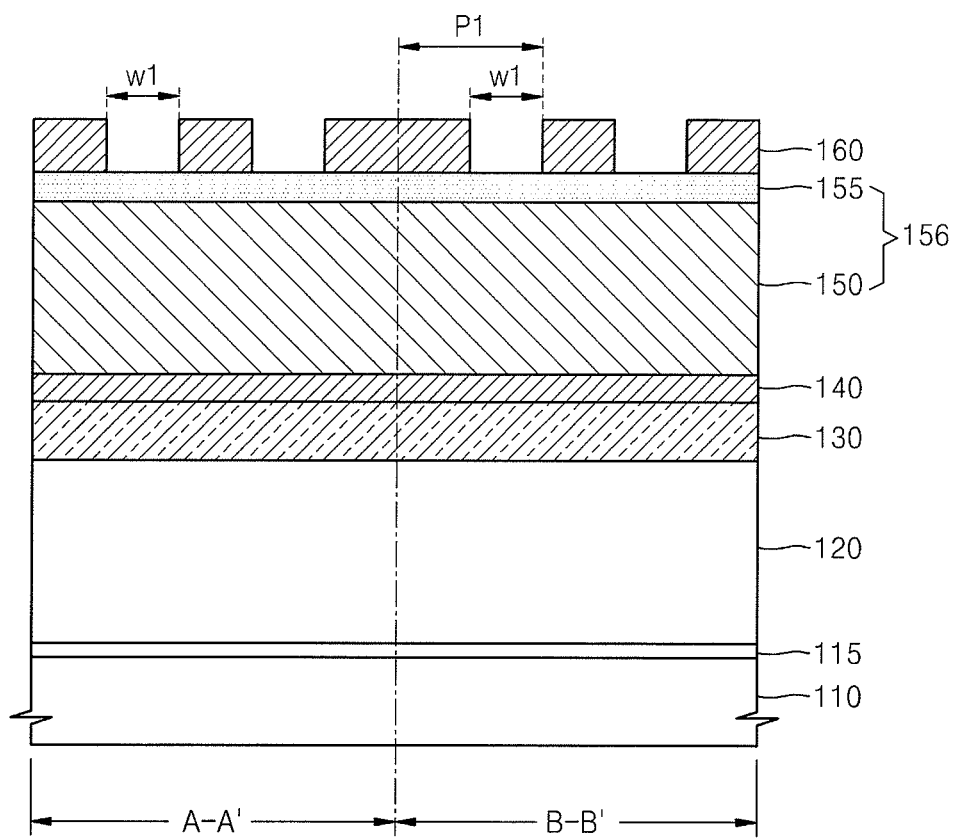

FIGS. 2A and 2B are planar and cross-sectional views illustrating forming a first hardmask 156 and a first photoresist pattern 160, according to an embodiment of the inventive concept. Referring to FIGS. 2A and 2B, a third material layer 150 is formed on the second material layer 140. The third material layer 150 may be formed of a material having an etch selectivity with respect to the second material layer 140 and/or the first material layer 130. The third material layer 150 may comprise, for example, a carbon-containing layer, and particularly, a spin-on hardmask (SOH) or an amorphous carbon layer (ACL). For example, an organic compound layer can be formed by spin-coating an organic compound to a thickness of about 1000 to 5000 Å so as to form the third material layer 150. In some embodiments, the organic compound may comprise, a hydrocarbon compound containing an aromatic ring, such as phenyl, benzene, or naphthalene, or a derivative thereof. In some embodiments, the organic compound may be formed of a material having a relatively high carbon content of about 85 to 99% by weight of the total weight of the organic compound. In some embodiments, the carbon-containing layer may be obtained by primarily baking the organic compound layer at about 150 to 350 C. In some embodiments, the primary baking may be performed for about sixty seconds. Then, the carbon-containing layer is hardened by secondarily baking it at a temperature of about 300 to 550 C. In some embodiments, the secondary baking may be performed for about thirty to three hundred seconds. Since the carbon-containing layer is secondarily baked to be hardened, the carbon-containing layer is not affected even if another material is deposited on the carbon-containing layer at a relatively high temperature, e.g., about 400 C or higher.

A fourth material layer 155 may be formed on the third material layer 150. The fourth material layer 155 may be formed of, for example, silicon nitride or silicon oxy-nitride. However, the inventive concept is not limited thereto, and the fourth material layer 155 may be formed of at least one of other various materials. The fourth material layer 155 may have certain properties so as to prevent reflection of light from a surface of the third material layer 150 during a subsequent photolithographic process, thereby enabling fabrication of a semiconductor device of approximately desired design dimensions.

The third material layer 150 together with the fourth material layer 155 may be referred to as the first hardmask 156. Depending on conditions of the subsequent photolithographic process, e.g., a type of optical source, exposure conditions, and the shape or properties of a photoresist pattern, the fourth material layer 155 may not be needed. In this case, the first hardmark 156 may include only the third material layer 150. Hereinafter, the first hardmask 156 is understood as including a stack of the third material layer 150 and the fourth material layer 155, or, optionally, the third material layer 150 alone.

The first photoresist pattern 160 is formed on the fourth material layer 155. In a case where the fourth material layer 155 is not present, as described above, the first photoresist pattern 160 is formed on the third material layer 150. The first photoresist pattern 160 includes a plurality of patterns that extend in a first direction, wherein the first direction is a first horizontal direction relative to a horizontal direction of extension of the substrate, and are spaced apart from each other at a predetermined interval w1, and each of the patterns has a first predetermined pitch P1. The predetermined interval w1 may correspond to the dimension of a first width of each hole to be formed in a target layer pattern 120a which is described below.

If the plurality of patterns each having the first pitch P1 cannot be formed due to a limit of the photolithographic process, then a Double Patterning Technology (DPT) that is well known to those of ordinary skill in the art may be used. In this case, a plurality of patterns each having a fourth pitch P4 that is greater than the first pitch P1 may be first formed according to the photolithographic process, and subsequently, depositing an additional thin film, forming a spacer pattern, and an etching process may be performed to form the plurality of patterns each having the first pitch P1.

Figure 3A:
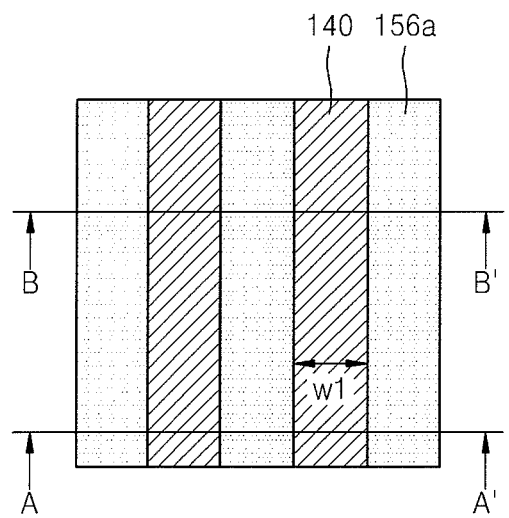
Figure 3B:
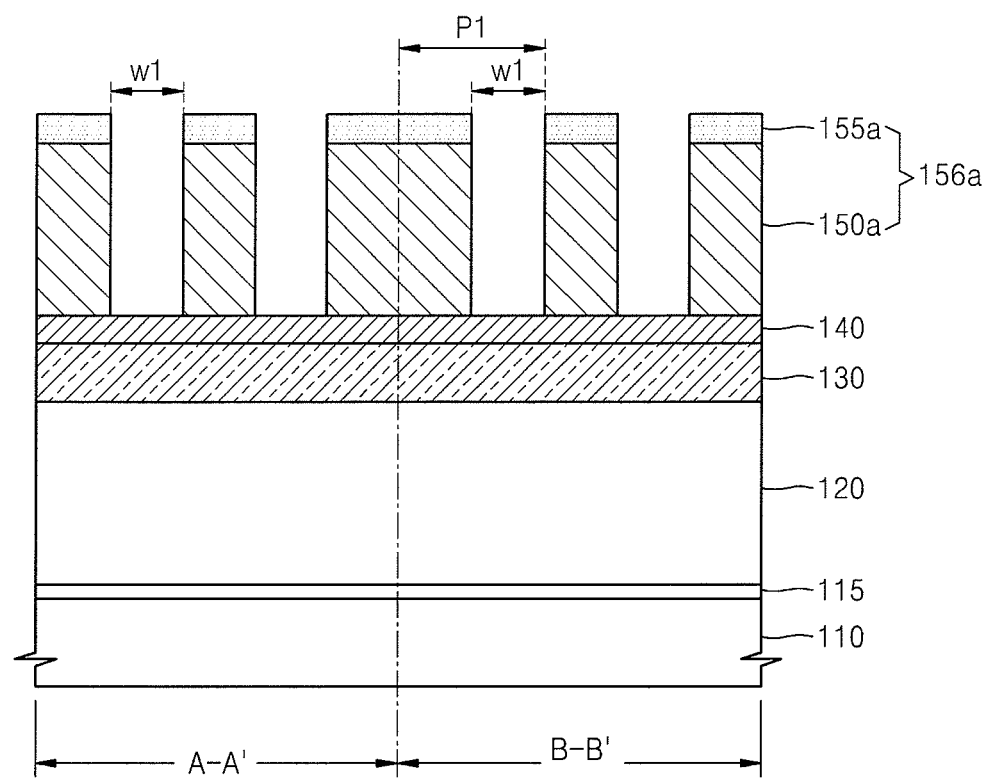

FIGS. 3A and 3B are plane and cross-sectional views illustrating forming a plurality of first hardmask patterns 156a, according to an embodiment of the inventive concept. Referring to FIGS. 3A to 3B, the first hardmask 156 is etched using the first photoresist pattern 160 as an etch mask to form the plurality of first hardmask patterns 156a extending in the first direction on the second material layer 140. The plurality of first hardmask patterns 156a extend in the first direction and are spaced apart from each other at the predetermined interval w1 and each of the plurality of first hardmask patterns 156a has the first predetermined pitch P1. The plurality of first hardmask patterns 156a may include at least one of a third material layer pattern 150a and a fourth material layer pattern 155a.

In a case where the first hardmask 156 is a carbon-containing layer, such as an SOH or an ACL, the first hardmask 156 may be etched using an etch gas containing oxygen ($O_2$).

Figure 4A:
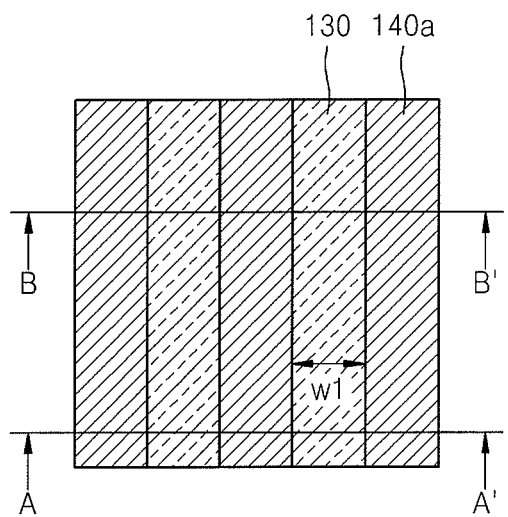
Figure 4B:
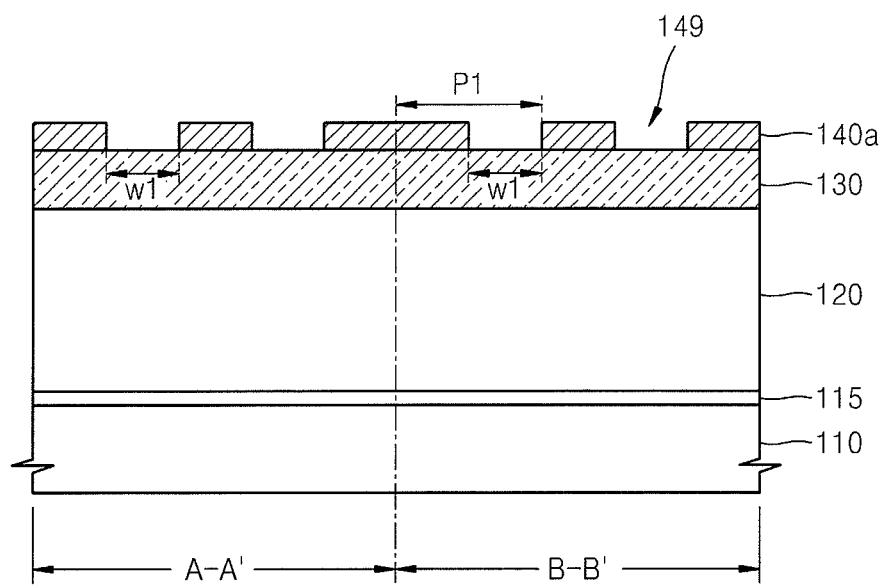

FIGS. 4A and 4B are plane and cross-sectional views illustrating forming second material layer patterns 140a, according to an embodiment of the inventive concept. Referring to FIGS. 4A and 4B, the second material layer patterns 140a are formed by etching the second material layer 140 by using the plurality of first hardmask patterns 156a as an etch mask. As a result, the second material layer patterns 140a extend in a first direction and are spaced apart from each other at a predetermined interval w1, and each have a first predetermined pitch P1.

In a case where the second material layer 140 includes an oxide, the second material layer 140 may be etched using an etch gas containing a fluorocarbon ($C_xF_y$) gas. For example, the fluorocarbon ($C_xF_y$) gas may be $CF_4$, $C_2F_6$, $C_3F_8$, $CH_2F_2$, $C_4F_8$, or the like. As described above, in some embodiments, the second material layer 140 may be far thinner than the target layer 120. Accordingly, an aspect ratio of the height of each of the holes in the second material layer patterns 140a to the width thereof is not relatively high, and a carbon-containing polymer is thus not likely to form on the plurality of first hardmask patterns 156a.

Figure 5A:
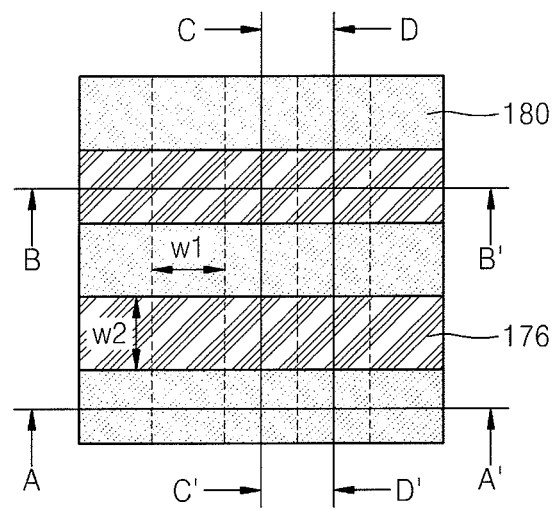
Figure 5B:
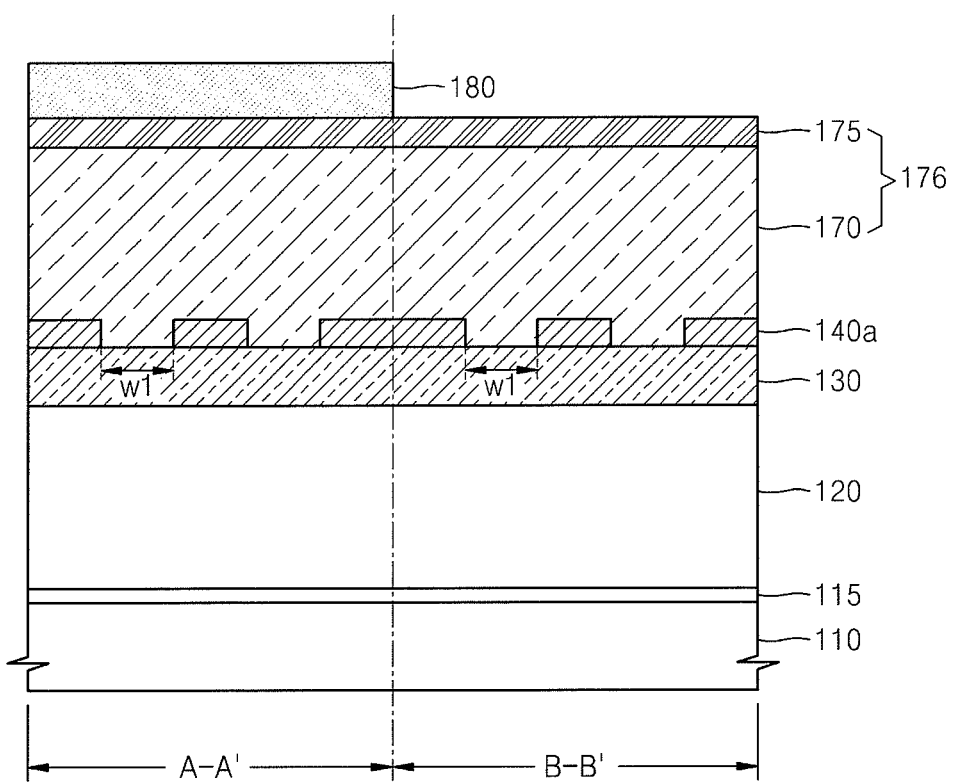
Figure 5C:
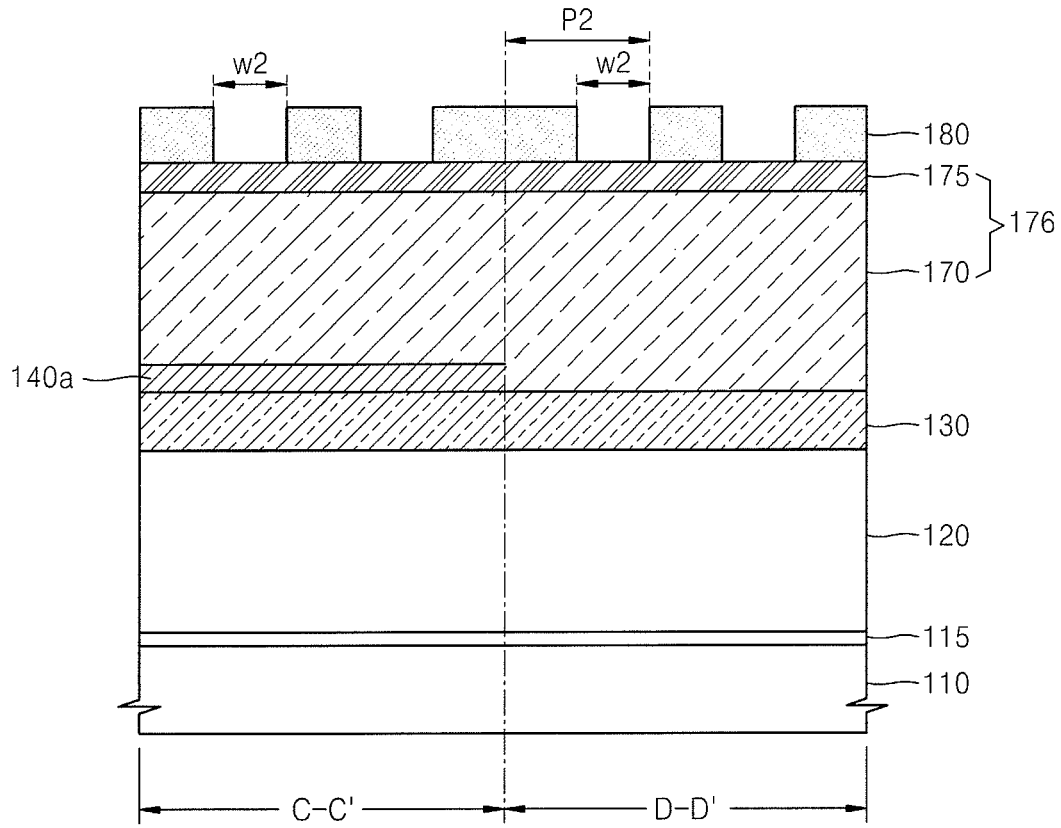

FIGS. 5A, 5B, and 5C are plane and cross-sectional views illustrating forming a second hardmask 176 and a second photoresist pattern 180, according to an embodiment of the inventive concept. Referring to FIGS. 5A to 5C, a third material layer 170 is formed on the second material layer patterns 140a and the first material layer 130. The third material layer 170 is formed in such a manner that a plurality of gaps between the second material layer patterns 140a may be filled with the third material layer 170 and both the second material layer patterns 140a and, in some embodiments, the first material layer 130 may be completely covered by the third material layer 170. In some embodiments, the third material layer 170 may be formed of a material having an etch selectivity with respect to the second material layer patterns 140a and the first material layer 130. In some embodiments, the third material layer 170 may comprise, for example, a carbon-containing layer, and particularly, an SOH or an ACL. Since the gaps between the second material layer patterns 140a are to be filled with the third material layer 170, in some embodiments, the third material layer 170 may be formed of SOH having reflow characteristics, rather than the ACL obtained according to a deposition process. For example, in some embodiments, the third material layer 170 may be obtained by forming an organic compound layer by spin-coating an organic compound to a thickness of about 1000 to 5000 Å. In some embodiments, the organic compound may comprise a hydrocarbon compound containing an aromatic ring, such as phenyl, benzene, or naphthalene, or a derivative thereof. In some embodiments, the organic compound may comprise a material having a relatively high carbon content of about 85 to 99% by weight of the total weight of the organic compound. In some embodiments, the carbon-containing layer may be obtained by primarily baking the organic compound layer at about 150 to 350 C. In some embodiments, the primary baking may be performed for about sixty seconds. Then, the carbon-containing layer can be hardened by secondarily baking it at about 300 to 550 C. In some embodiments, the secondary baking may be performed for about thirty to three hundred seconds. Since the carbon-containing layer is secondarily baked to be hardened, the carbon-containing layer is not affected even if another material is deposited on the carbon-containing layer at a relatively high temperature, e.g., about 400 Å or higher.

A fourth material layer 175 may be formed on the third material layer 170. The fourth material layer 175 may be formed of, for example, silicon nitride or silicon oxy-nitride. However, the inventive concept is not limited thereto, and the fourth material layer 175 may optionally be formed of at least one of other various materials. The fourth material layer 175 may be formed to prevent reflection of light from a surface of the third material layer 170 during a subsequent photolithographic process, thereby enabling to fabricate a semiconductor device of approximately desired design dimensions.

The third material layer 170 together with the fourth material layer 175 may be referred to as the second hardmask 176. Depending on conditions of the subsequent photolithographic process, e.g., a type of optical source, exposure conditions, and the shape or properties of a photoresist pattern, the fourth material layer 175 may not be necessary. In this case, the second hard mark 176 may include only the third material layer 170. Hereinafter, the second hardmask 176 is understood as including a stack of the third material layer 170 and the fourth material layer 175, or the third material layer 170 alone.

The second photoresist pattern 180 is formed on the fourth material layer 175. In a case where the fourth material layer 175 is not formed, as described above, the second photoresist pattern 180 is formed on the third material layer 170. The second photoresist pattern 180 includes a plurality of patterns that extend in a second horizontal direction, which is different from the first direction, and are spaced apart from each other at a predetermined interval w2, and that each have a second predetermined pitch P2. The second direction may be substantially perpendicular to the first direction. The predetermined interval w2 corresponds to the dimension of a second width of each hole to be formed in the target layer pattern 120a which is described below.

If the plurality of patterns each having the second pitch P2 cannot be formed due to a limit of the photolithographic process, then a Double Patterning Technology (DPT) that is well known to those of ordinary skill in the art may be used instead. In this case, a plurality of patterns each having a fourth pitch P4 that is greater than the second pitch P2 may be first formed according to the photolithographic process, and subsequently, the processing steps of depositing an additional thin film, forming a spacer pattern, and an etching process may be performed to form the plurality of patterns each having the second pitch P2.

Figure 6A:
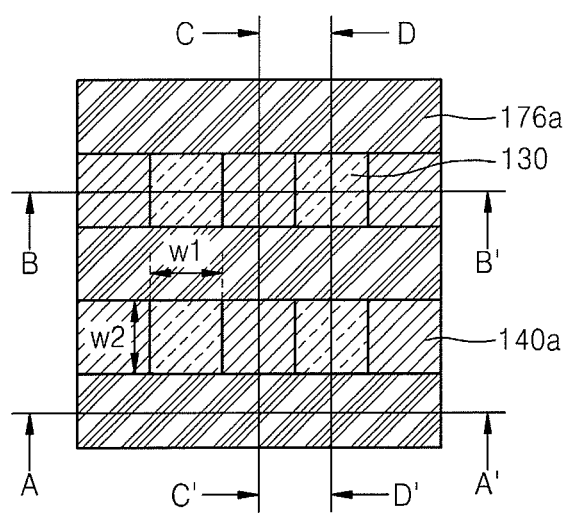
Figure 6B:
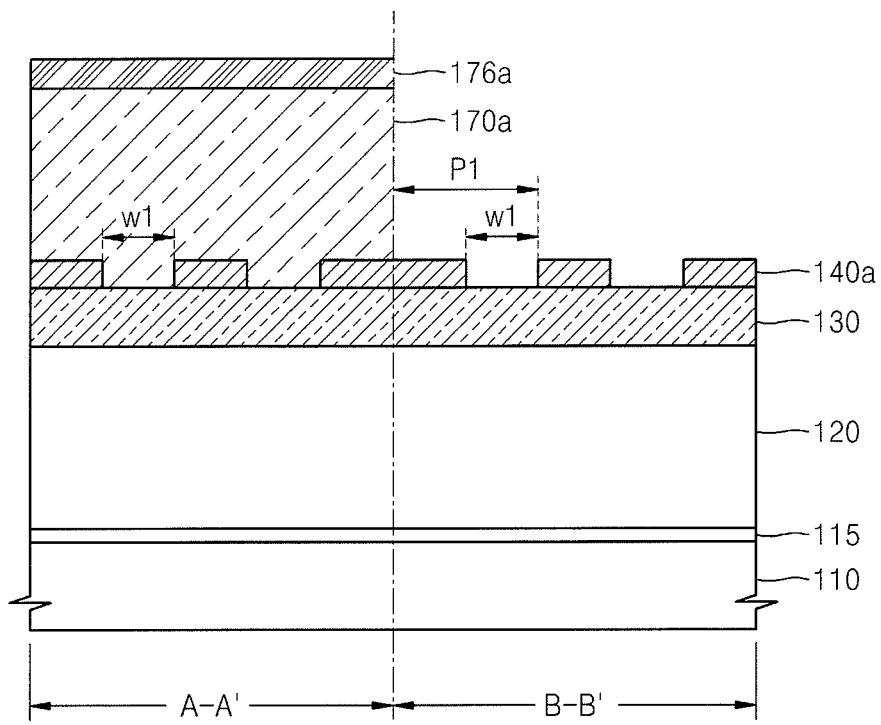
Figure 6C:
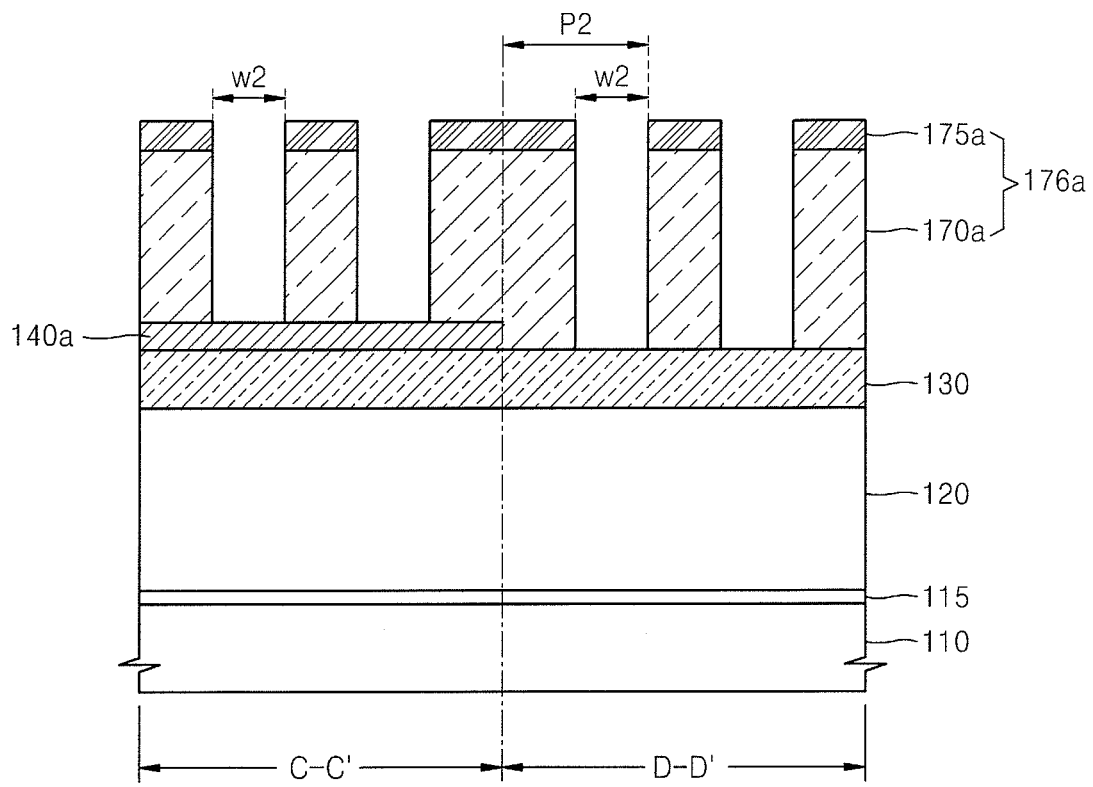

FIGS. 6A, 6B, and 6C are plane and cross-sectional views illustrating forming a plurality of second hardmask patterns 176a, according to an embodiment of the inventive concept. Referring to FIGS. 6A to 6C, the second hardmask 176 is etched using the second photoresist pattern 180 as an etch mask so as to form the second hardmask patterns 176a extending in the second direction on the second material layer patterns 140a and the first material layer 130. The plurality of second hardmask patterns 176a extend in the second direction and are spaced apart from each other at a predetermined interval w2, wherein each of the plurality of second hardmask patterns 176a has a second predetermined pitch P2. In some embodiments, the plurality of second hardmask patterns 176a may include a stack of the third material layer pattern 170a and the fourth material layer pattern 175a, or, in other embodiments, the third material layer pattern 170a alone.

In a case where the second hardmask 176 is a carbon-containing layer, such as an SOH or an ACL, the second hardmask 176 may be etched, for example, using an etch gas containing $O_2$.

Figure 7A:
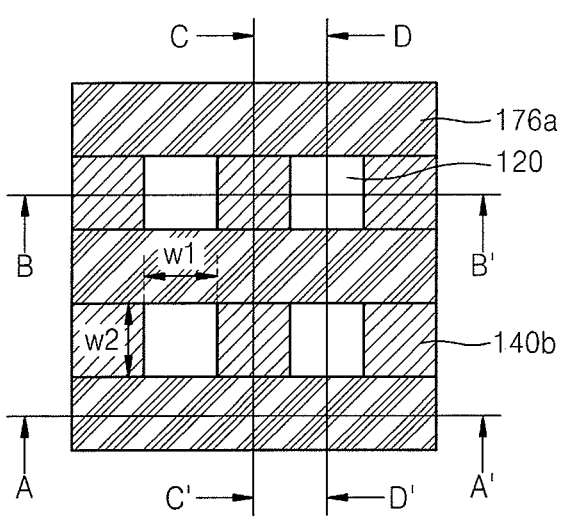
Figure 7B:
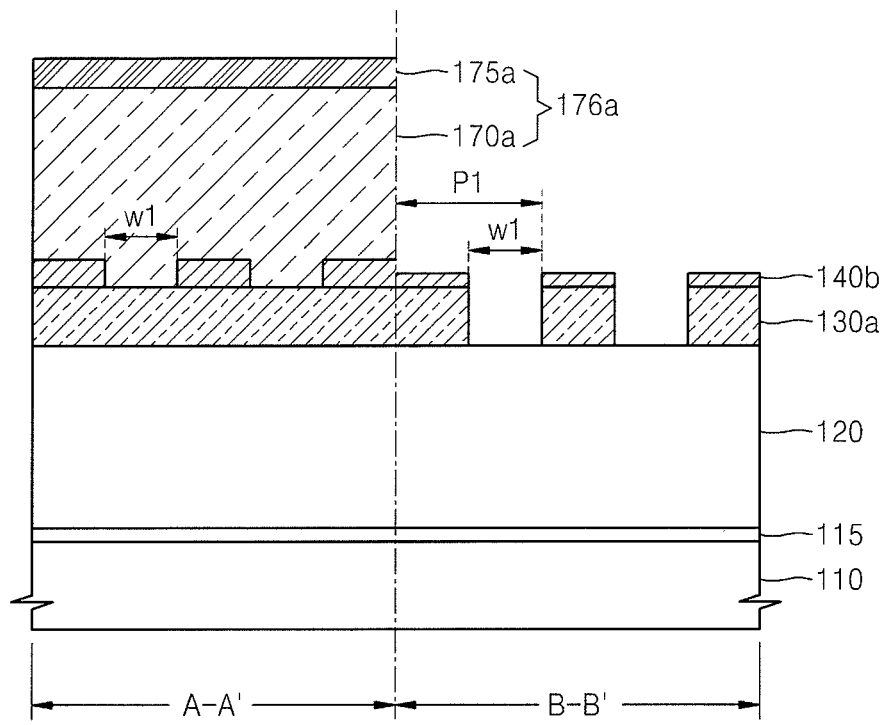
Figure 7C:
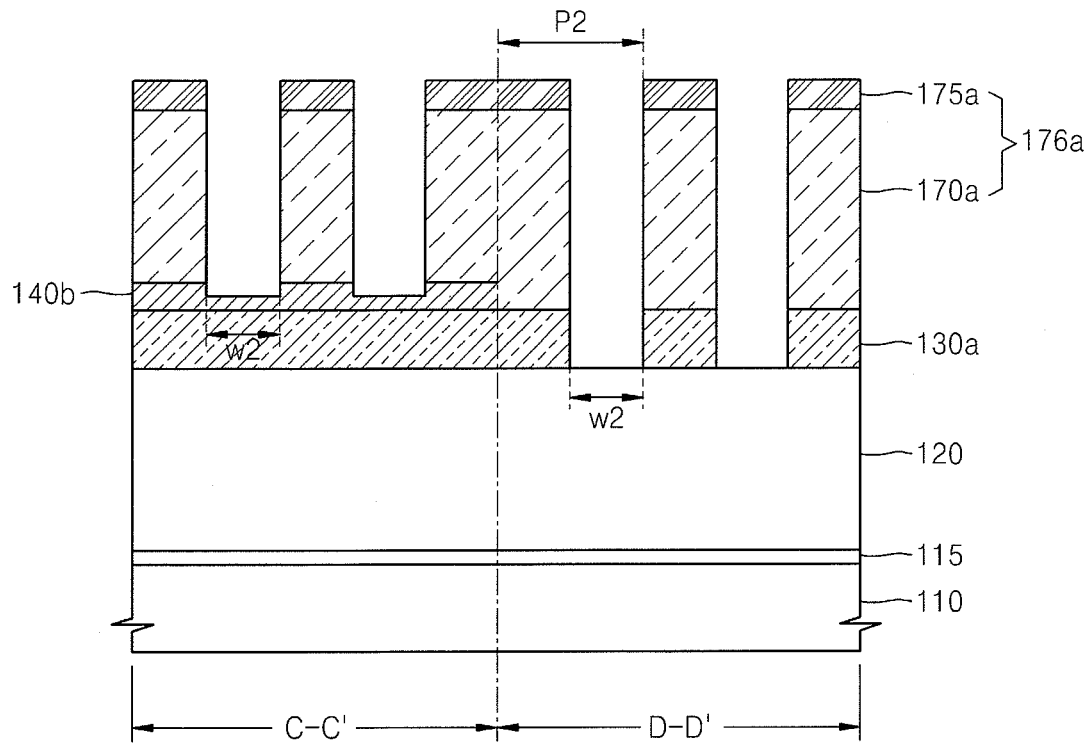

FIGS. 7A, 7B, and 7C are plane and cross-sectional views illustrating forming a plurality of first material layer patterns 130a, according to an embodiment of the inventive concept. Referring to FIGS. 7A to 7C, the plurality of first material layer patterns 130a are formed by etching the first material layer 130 by using the plurality of second hardmask patterns 176a and the second material layer patterns 140a as etch masks. In a first direction, the plurality of first material layer patterns 130a includes a plurality of patterns disposed apart from each other at a predetermined interval w1 and each of the plurality of first material layer patterns 130a has a predetermined first pitch P1, taken along the B-B' line of FIG. 7A. At the same time, in a second direction, the plurality of first material layer patterns 130a includes a plurality of patterns that are disposed apart from each other at a predetermined interval w2 and that each have a predetermined second pitch P2, taken along the D-D' line of FIG. 7A.

If the first material layer 130 includes TiN, the first material layer 130 may be etched using an etch gas containing a chlorine ($Cl_2$) gas. When the plurality of second hardmask patterns 176a each including a carbon-containing material are used as an etch mask to etch the first material layer 130, the etch gas containing the $Cl_2$ gas hardly causes a polymer to be formed on the plurality of second hardmask patterns 176a.

If an etch selectivity between the first material layer 130 and the second material layer patterns 140a is not remarkably high, then upper surfaces of the second material layer patterns 140a are etched during the etching of the first material layer 130, and thus, the resulting thickness of each of the second material layer patterns 140b may thus be less than their previous thickness, that is, prior to the etching of the first material layer 130, as shown in FIG. 7C.

Figure 8A:
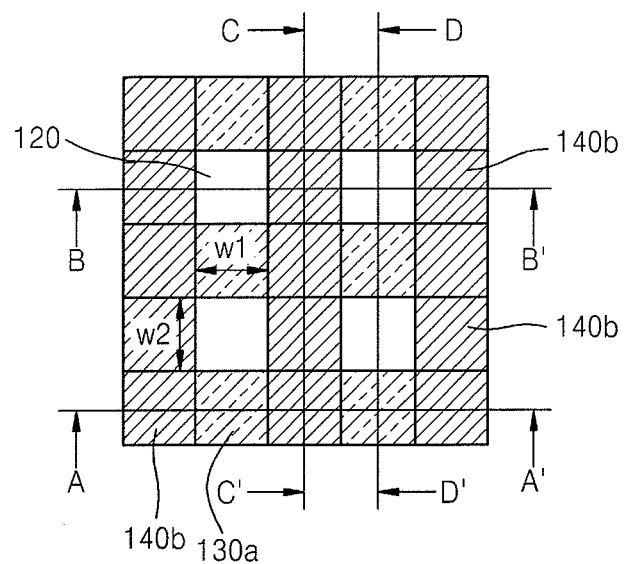
Figure 8B:
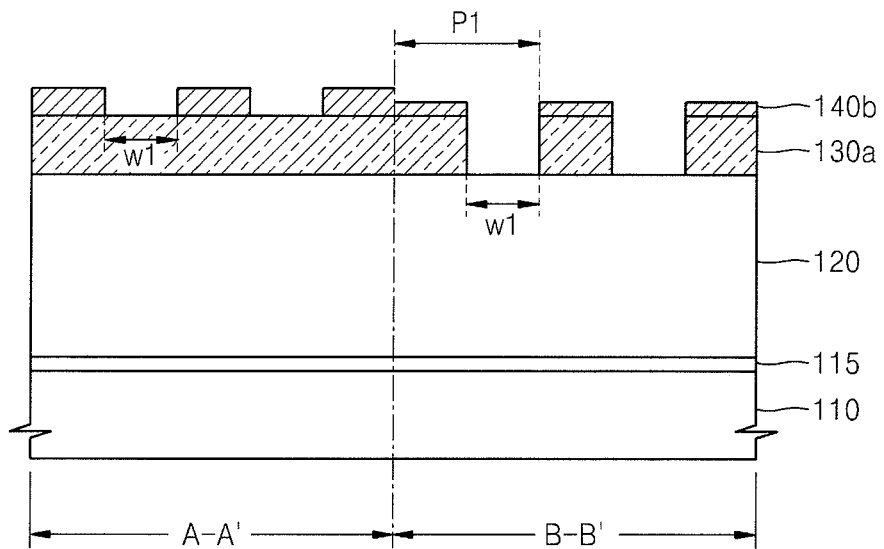
Figure 8C:
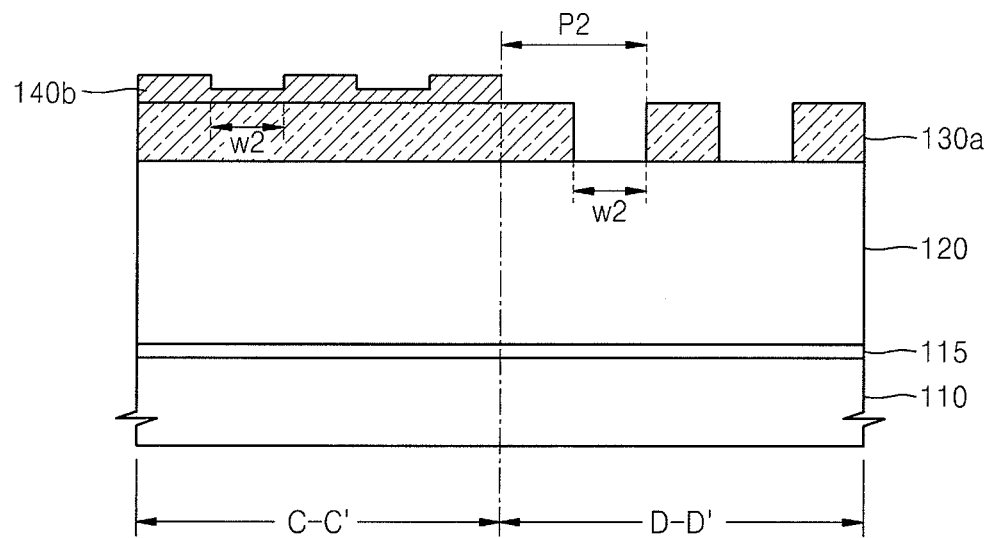

FIGS. 8A, 8B, and 8C are plane and cross-sectional views further illustrating the forming of the plurality of first material layer patterns 130a, illustrated in FIGS. 7A to 7C. Referring to FIGS. 8A to 8C, the plurality of second hardmask patterns 176a are removed to expose the first and second material layer patterns 130a and 140b. During the etching process of the first material layer 130, the plurality of second hardmask patterns 176a may be completely removed. In a case where the plurality of second hardmask patterns 176a are not completely removed, additional dry or wet etching processes may be further performed to remove them.

Figure 9A:
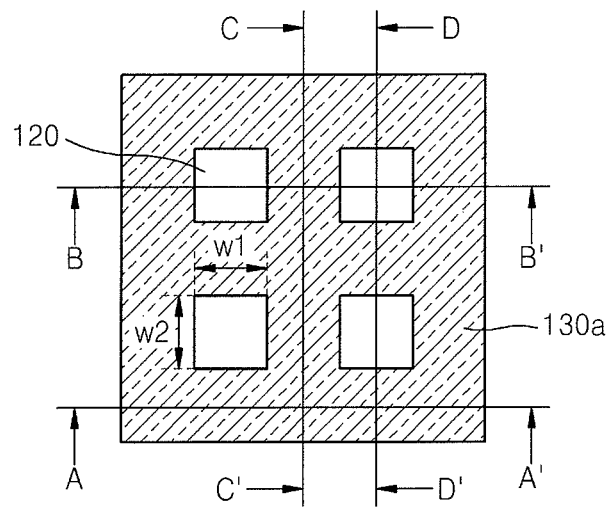
Figure 9B:
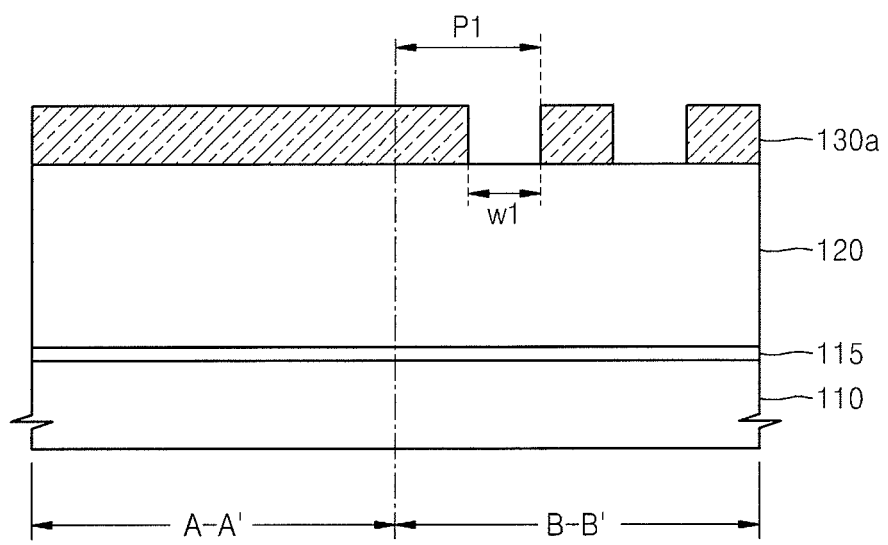
Figure 9C:
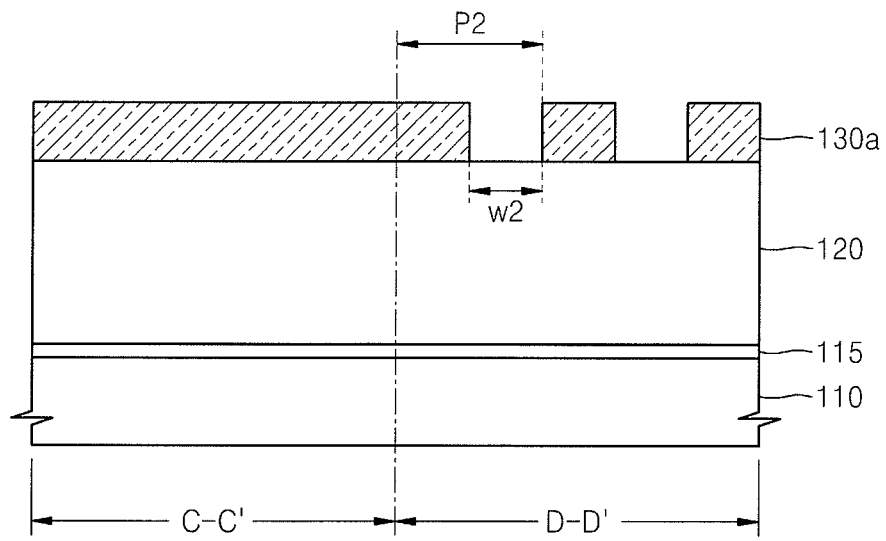

FIGS. 9A, 9B, and 9C are plane and cross-sectional views further illustrating the forming of the first material layer pattern 130a, illustrated in FIGS. 7A to 7C. Referring to FIGS. 9A to 9C, the second material layer patterns 140b are removed to completely expose an upper surface of the first material layer pattern 130a. The first material layer pattern 130a includes a line pattern extending in the second direction, taken along the A-A' section line of FIG. 7A, include a plurality of patterns that are disposed apart from each other at a predetermined interval w1 in the second direction and that each have a predetermined first pitch P1, taken along the B-B' section line of FIG. 7A, include a line pattern extending in the first direction, taken along the section line C-C', and include a plurality of patterns that are disposed apart from each other at a predetermined interval w2 in the first direction and that each have a predetermined second pitch P2, taken along the section line D-D'. Thus, a plurality of holes having a first width w1 and a second width w2 in the second and first directions, respectively, are formed in regions of the first material layer pattern 130a, in which the B-B' line and the D-D' line intersect each other.

In some embodiments, the first direction and second direction are perpendicular to each other. In some embodiments, the first and second directions are at an angle to each other that is other than perpendicular. In an embodiment where the first direction and the second direction are perpendicular to each other, then each of the holes has a square shape when the first width w1 and the second width w2 are the same and has a rectangular shape when the first width w1 and the second width w2 are different from each other.

If the first direction and the second direction are not perpendicular to each other but intersect each other, then each of the holes has a diamond, or rhombus, shape when the first width w1 and the second width w2 are the same and has a parallelogram shape when the first width w1 and the second width w2 are different from each other.

Figure 10A:
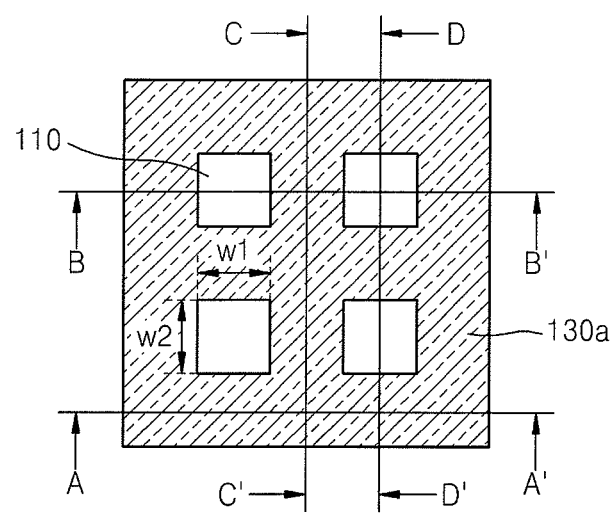
Figure 10B:
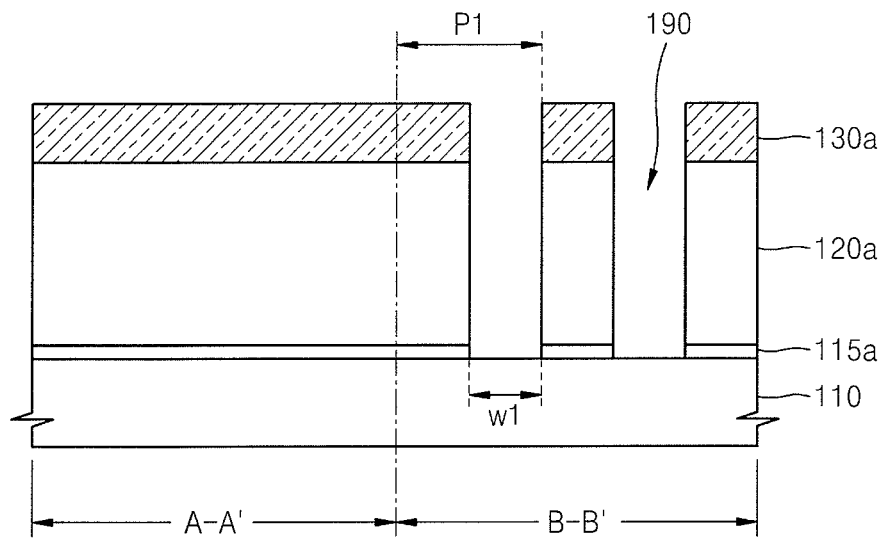
Figure 10C:
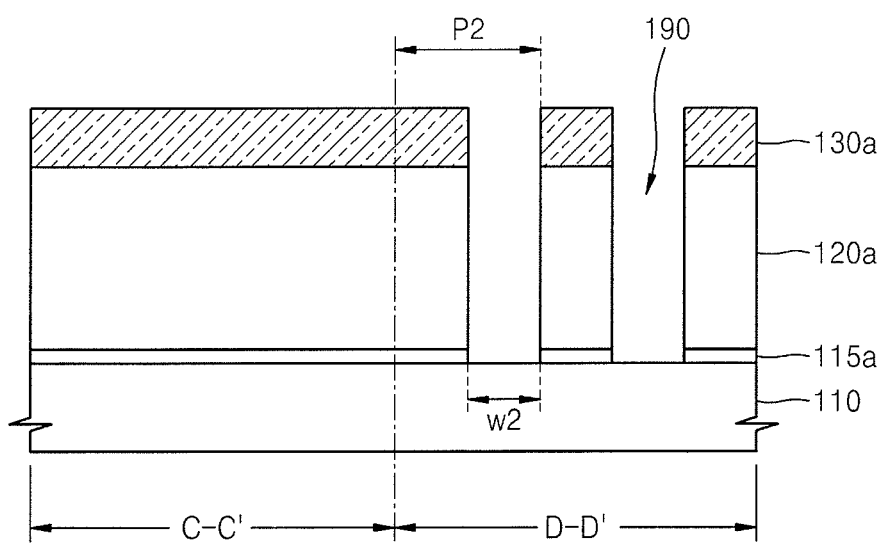

FIGS. 10A, 10B, and 10C are plane and cross-sectional views illustrating forming the target layer pattern 120a, according to an embodiment of the inventive concept. Referring to FIGS. 10A to 10C, the target layer pattern 120a is formed with a plurality of holes 190 by etching the target layer 120 using the first material layer pattern 130a as an etch mask. The etch mask used to etch the target layer 120 includes only the first material layer pattern 130a. However, according to another embodiment of the inventive concept, the target layer pattern 120a may be formed by etching the target layer 120 by using both the remaining second material layer patterns 140b and the first material layer pattern 130a positioned below the remaining second material layer patterns 140b as etch masks, without having to remove the remaining second material layer patterns 140b on the first material layer pattern 130a (see FIGS. 9A to 9C). The substrate 110 may be exposed by partially removing the etch stop layer 115 during the etching of the target layer 120. If the etch stop layer 115 is not formed, the processing step of partial removal of the etch stop layer 115 may be skipped.

In a case where the target layer 140 includes an oxide, the target layer 120 may be etched using an etch gas containing a fluorocarbon ($C_xF_y$) gas. For example, the fluorocarbon ($C_xF_y$) gas may be $CF_4$, $C_2F_6$, $C_3F_8$, $CH_2F_2$, $C_4F_8$, or the like. A carbon-containing polymer may be formed on the carbon-containing layer and/or the oxide when the etch gas containing the fluorocarbon ($C_xF_y$) gas reacts with an etching by-product of the oxide and the carbon-containing layer.

In some embodiments, the plurality of second hardmask patterns 176a are removed before the target layer pattern 120a is formed. Thus, in these embodiments, the second hardmask 176 including a carbon-containing layer, such as an SOH or an ACL, is not used as an etch mask during the etching of the target layer 120.

In other embodiments, portions or all of the plurality of second hardmask patterns 176a can remain. In these other embodiments, the plurality of second hardmask patterns 176a are used as an etch mask during the etching of the target layer 120, the etch gas containing the fluorocarbon ($C_xF_y$) gas may react with an etching by-product of the target layer 120 and the second hardmask 176, thus causing a carbon-containing polymer to be formed on the second hardmask 176 and/or the target layer 120. The greater the aspect ratio of the width of each of the plurality of holes 190 to be formed relative to the height thereof, the more this phenomenon is likely to occur. The presence of the polymer may cause the dimensions of the plurality of holes 190 in the target layer pattern 120a to be reduced.

Since the second material layer patterns 140a serve as a part of etch masks during the forming of the first material layer pattern 130a, it may be possible to etch the target layer 120 by using only the first material layer pattern 130a as an etch mask after the plurality of second hardmask patterns 176a are removed. Thus, since the second material layer patterns 140a are disposed between the first material layer 130 and the plurality of second hardmask patterns 176a, the target layer 120 may be etched after the plurality of second hardmask patterns 176a are removed.

Figure 11A:
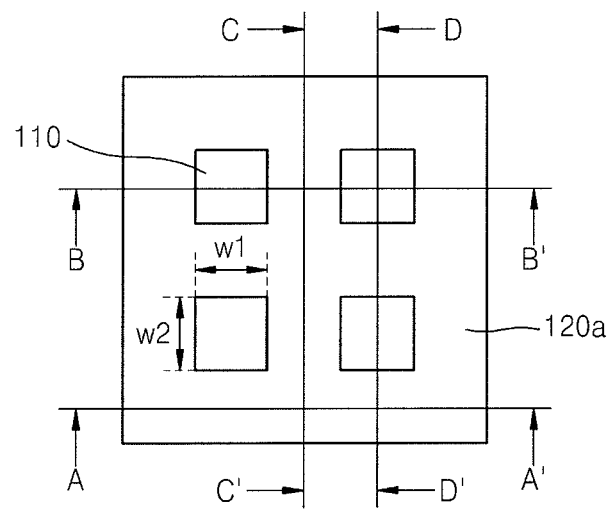
Figure 11B:
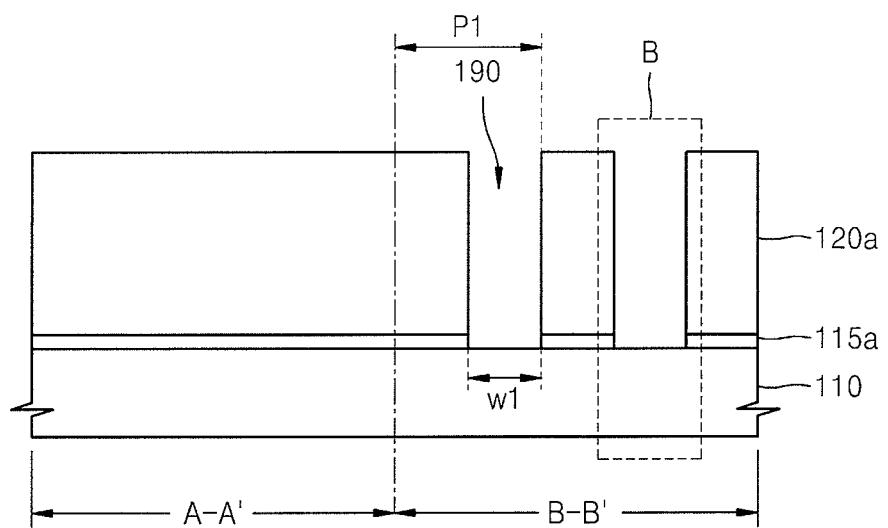
Figure 11C:
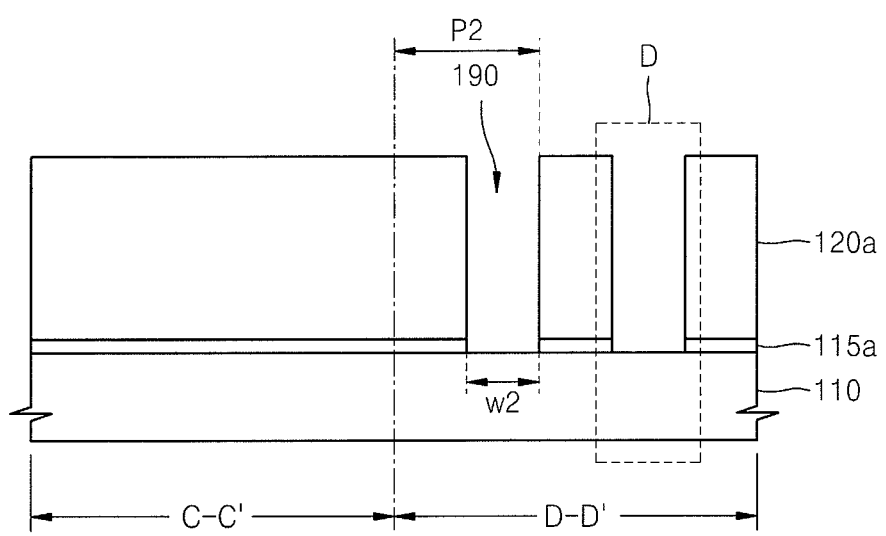

FIGS. 11A, 11B, and 11C are plane and cross-sectional views further illustrating forming the target layer pattern 120a, according to an embodiment of the inventive concept. Referring to FIGS. 11A to 11C, an upper surface of the target layer pattern 120a may be completely exposed by removing the first material layer pattern 130a. The target layer pattern 120a includes a line pattern extending in the second direction, taken along the A-A' line of FIG. 11A, includes a plurality of patterns that are disposed apart from each other at a predetermined interval w1 in the second direction and that each have a predetermined first pitch P1, taken along the B-B' line of FIG. 11A, includes a line pattern extending in the first direction, taken along the line C-C' of FIG. 11A, and includes a plurality of patterns that are disposed apart from each other at a predetermined interval w2 in the first direction and that each have a predetermined second pitch P2, taken along the line D-D' of FIG. 11A. Thus, the plurality of holes 190 having a first width w1 and a second width w2, in the second and first directions, respectively, are formed in a region of the target layer pattern 120a, in which the B-B' line and the D-D' line intersect each other.

If the first direction and the second direction are perpendicular to each other, then a horizontal cut of each of the plurality of holes 190 with respect to the substrate 110 has a square shape when the first width w1 and the second width w2 are the same and has a rectangular shape when the first width w1 and the second width w2 are different from each other.

If the first direction and the second direction are not perpendicular to each other but intersect each other, then a horizontal cut end of each of the plurality of holes 190 with respect to the substrate 110 has a diamond, or rhombus, shape when the first width w1 and the second width w2 are the same and has a parallelogram shape when the first width w1 and the second width w2 are different from each other.

In some embodiments, the plurality of holes 190 in the target layer pattern 120a may be filled with a conductive material. However embodiments of the present inventive concepts are not limited thereto. In other embodiments, the plurality of holes 190 may instead be filled with any of other various materials. Structures of the plurality of holes 190 will be described in detail below.

As described above, since the second material layer patterns 140a serve as a part of etch masks during the forming of the first material layer pattern 130a, it may be possible to etch the target layer 120 by using only the first material layer pattern 130a as an etch mask after the plurality of second hardmask patterns 176a are removed. This feature is a result of the second material layer patterns 140a being disposed between the first material layer 130 and the plurality of second hardmask patterns 176a. For better understanding of this function of the second material layer 140, a comparative example of a method of fabricating a semiconductor device according to an embodiment of the inventive concept as described above will be described, on an assumption that the second material layer 140 is not present.

FIGS. 12A to 19C are plane and cross-sectional views of a method of fabricating a semiconductor device, according to a comparative example of the inventive concept. Specifically, FIGS. 12A, 13A, 14A, 15A, 16A, 17A, 18A, and 19A are plan views illustrating the method of fabricating a semiconductor device, according to a comparative example of the inventive concept. FIGS. 12B, 13B, 14B, 15B, 16B, 17B, 18B, and 19B are cross-sectional views taken along the lines A-A' and B-B' of FIGS. 12A, 13A, 14A, 15A, 16A, 17A, 18A, and 19A, respectively. FIGS. 16C, 17C, 18C, and 19C are cross-sectional views taken along the lines C-C' and D-D' of FIGS. 16A, 17A, 18A, and 19A, respectively.

Figure 12A:
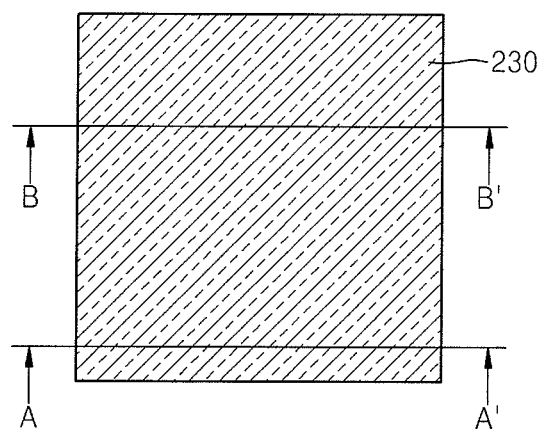
FIGS. 12A to 19C are plane and cross-sectional views of a method of fabricating a semiconductor device, according to a comparative example of the inventive concept.
Figure 12B:
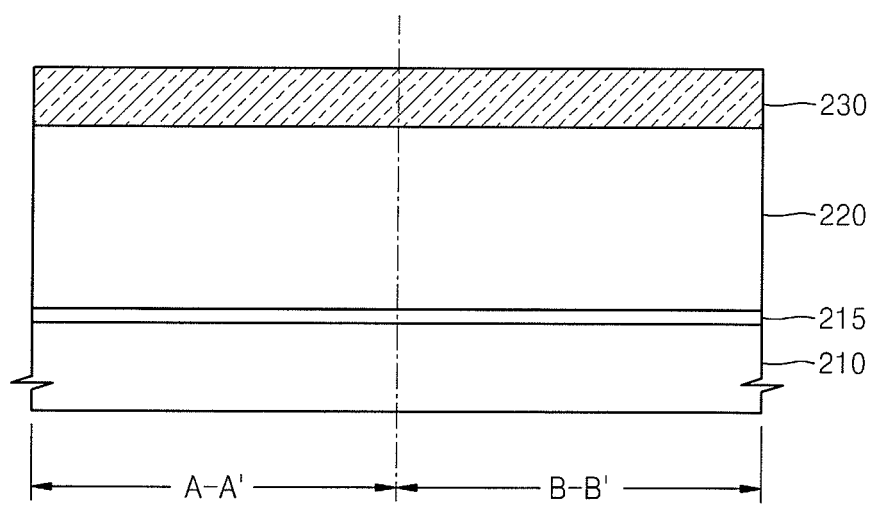

FIGS. 12A and 12B are plane and cross-sectional views illustrating forming a target layer 220 and a first material layer 230, according to a comparative example of the inventive concept. Referring to FIGS. 12A and 12B, the target layer 230 and the first material layer 230 are sequentially formed on a substrate 210. An etch stop layer 215 may be formed between the substrate 210 and the target layer 220.

The substrate 210, the etch stop layer 215, the target layer 220, and the first material layer 230 are respectively the same as the substrate 110, the etch stop layer 115, the target layer 120, and the first material layer 130 described above with reference to FIGS. 1A and 1B, and thus, their description will not be repeated here.

Figure 13A:
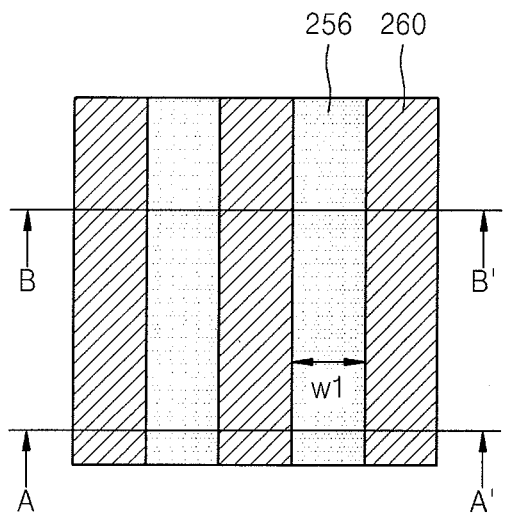
Figure 13B:
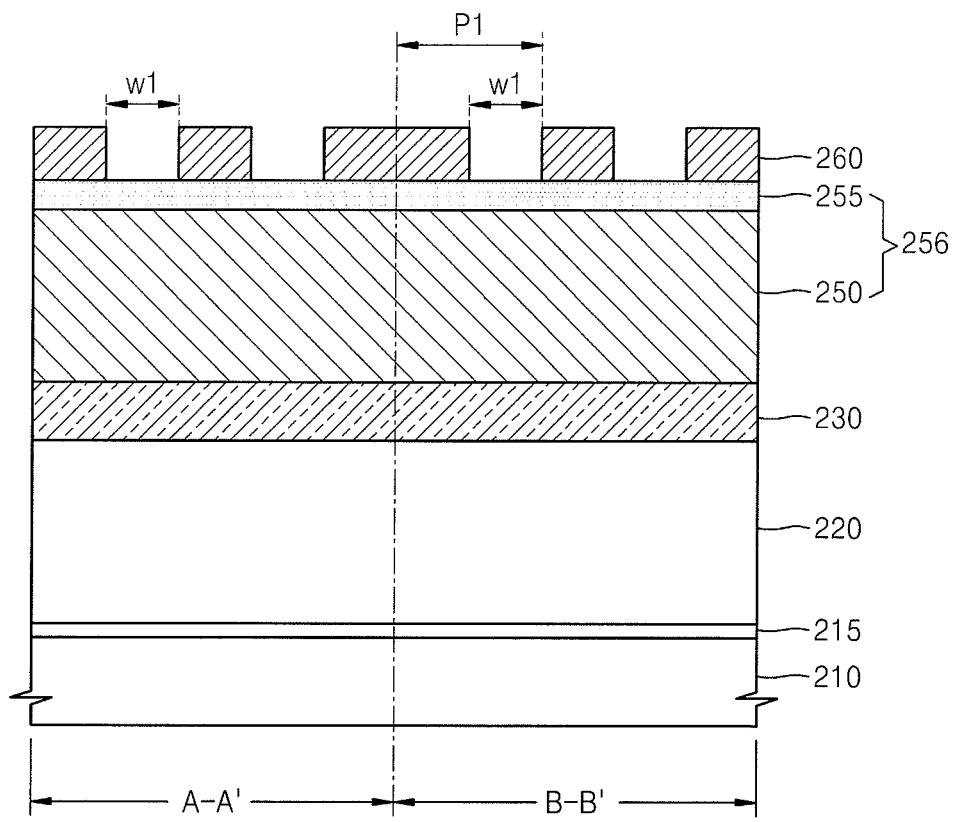

FIGS. 13A and 13B are plane and cross-sectional views illustrating forming a first hardmask 256 and a first photoresist pattern 260, according to a comparative example of the inventive concept. Referring to FIGS. 13A and 13B, a third material layer 250 is formed on the first material layer 230. In the present example embodiment, a second material layer, such as the second material layer 140 illustrated and described in connection with FIG. 1B, is not disposed between the first material layer 230 and the third material layer 250. A fourth material layer 255 may be formed on the third material layer 250. The third material layer 250 together with the fourth material layer 255 may be referred to as the first hardmask 256. The first photoresist pattern 260 is formed on the fourth material layer 255.

The third material layer 250, the fourth material layer 255, the first hardmask 256, and the first photoresist pattern 260 are respectively the same as third material layer 150, the fourth material layer 155, the first hardmask 156, and the first photoresist pattern 160 described above with reference to FIGS. 2A and 2B, and thus, their description will not be repeated here.

Figure 14A:
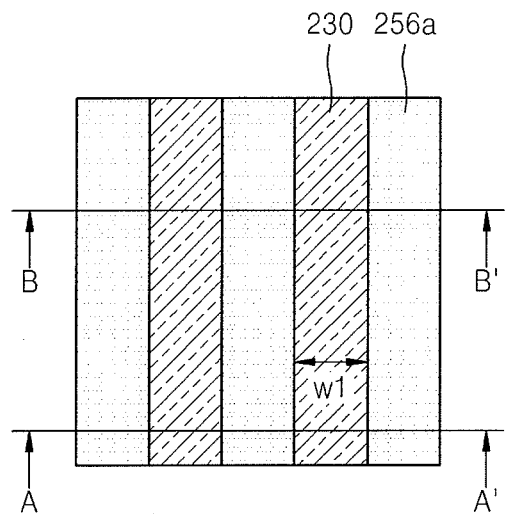
Figure 14B:
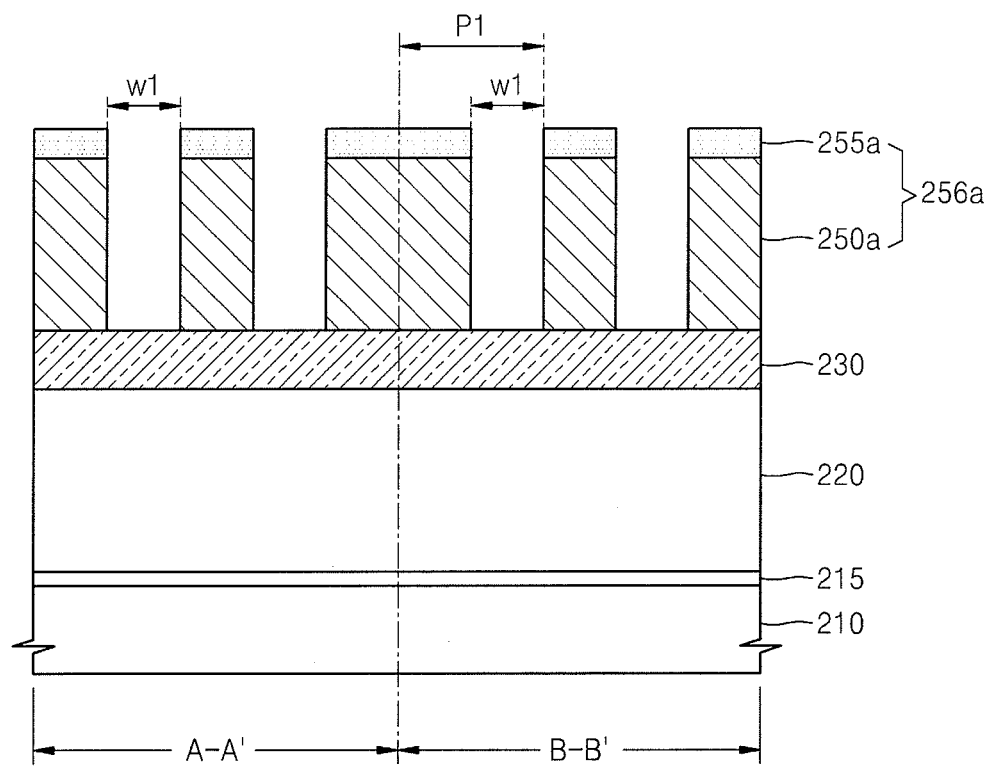

FIGS. 14A and 14B are plane and cross-sectional views illustrating forming a first hardmask pattern 256a, according to a comparative example of the inventive concept. Referring to FIGS. 14A to 14B, the first hardmask 256 is etched using the first photoresist pattern 260 as an etch mask to form the first hardmask pattern 256a that includes a plurality of patterns extending in the first direction on the first material layer 230. The first hardmask pattern 256a may include a stack of a third material layer pattern 250a and a fourth material layer pattern 255a, or, in another embodiment, the third material layer pattern 250a alone.

The third material layer pattern 250a, the fourth material layer pattern 255a, and the first hardmask pattern 256a are respectively the same as the third material layer pattern 150a, the fourth material layer pattern 155a, and the plurality of first hardmask patterns 156a described above with reference to FIGS. 3A and 3B, and thus, their description will not be repeated here.

Figure 15A:
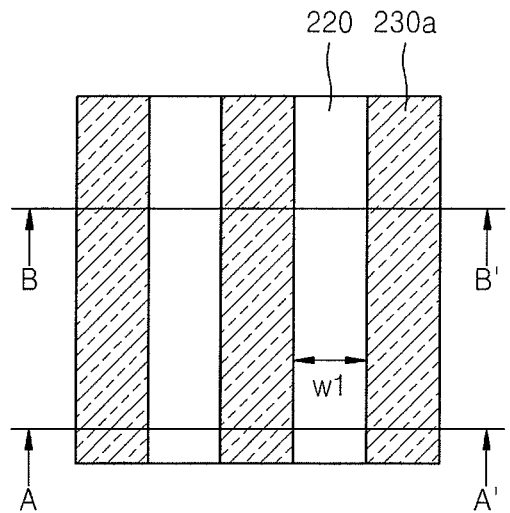
Figure 15B:
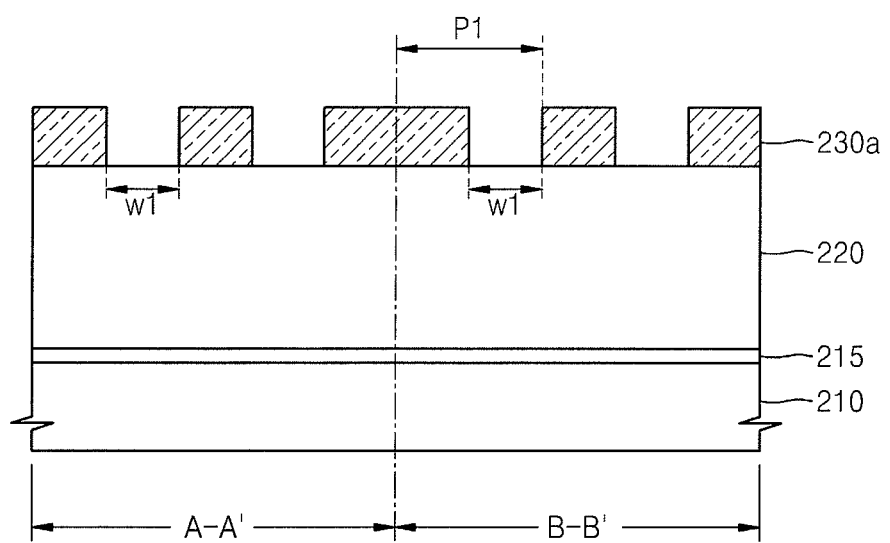

FIGS. 15A and 15B are plane and cross-sectional views illustrating forming a first material layer pattern 230a, according to a comparative example of the inventive concept. Referring to FIGS. 15A to 15B, the first material layer pattern 230a is formed by etching the first material layer 230 by using the first hardmask pattern 256a as an etch mask.

Referring to FIGS. 9A to 9C, the first material layer pattern 130a include a line pattern extending in the second direction, taken along the A-A' line, include a plurality of patterns that are disposed apart from each other at the predetermined interval w1 in the second direction and that each have the predetermined first pitch P1, taken along the B-B' line, include a line pattern extending in the first direction, taken along the line C-C', and include a plurality of patterns that are disposed apart from each other at the predetermined interval w2 in the first direction and that each have the predetermined second pitch P2, taken along the line D-D'. Thus, the plurality of holes having the first width w1 and the second width w2, in the second and first directions, respectively, are formed in regions of the first material layer pattern 130a, in which the B-B' line and the D-D' line intersect each other.

On the other hand, the first material layer pattern 230a according to a comparative example of the inventive concept includes a plurality of line patterns that extend in the first direction and are apart from each other. Thus, a plurality of holes cannot be formed in the target layer 220 by using only the first material layer pattern 230a. Accordingly, in order to form a plurality of holes in the target layer 220, it is not sufficient to use only the first material layer pattern 230a as an etch mask so as to etch the target layer 220. Thus, a subsequently formed second hardmask pattern 276a, which is described below, may not be removed, thereby serving also as a part of the etch mask.

Figure 16A:
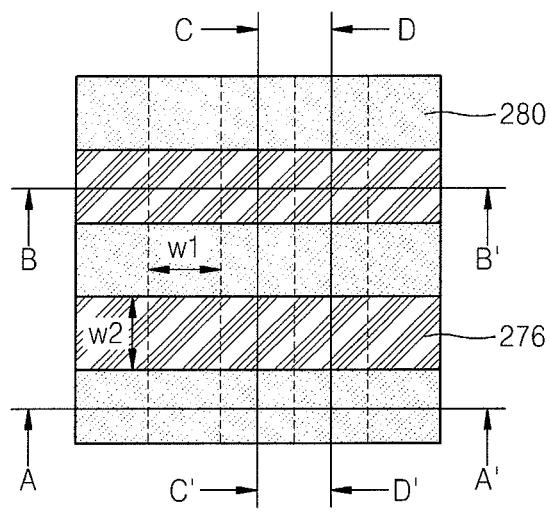
Figure 16B:
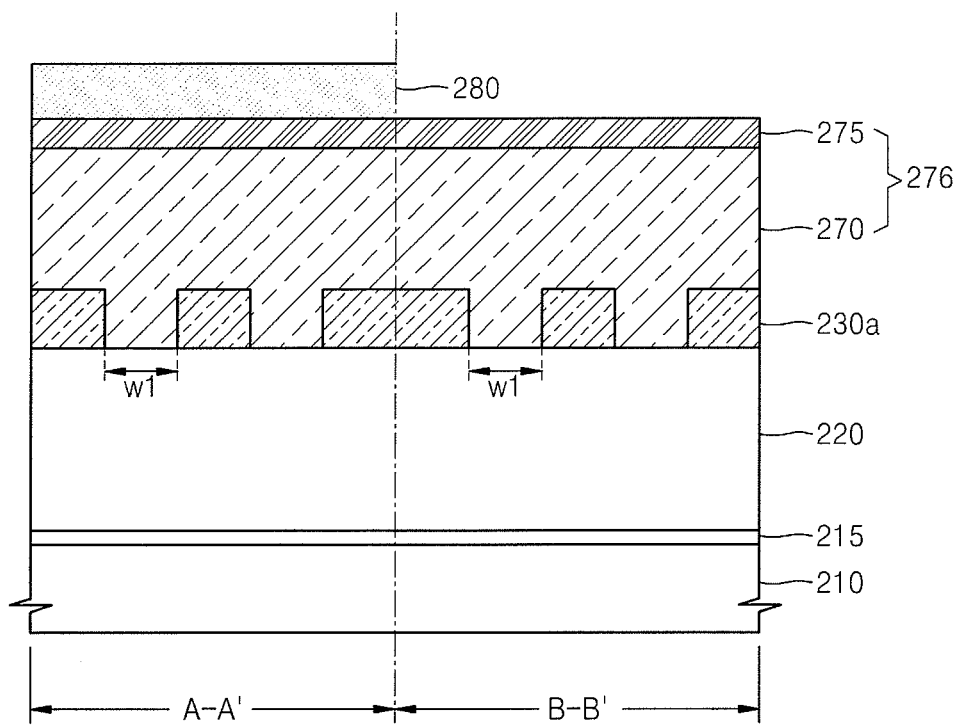
Figure 16C:
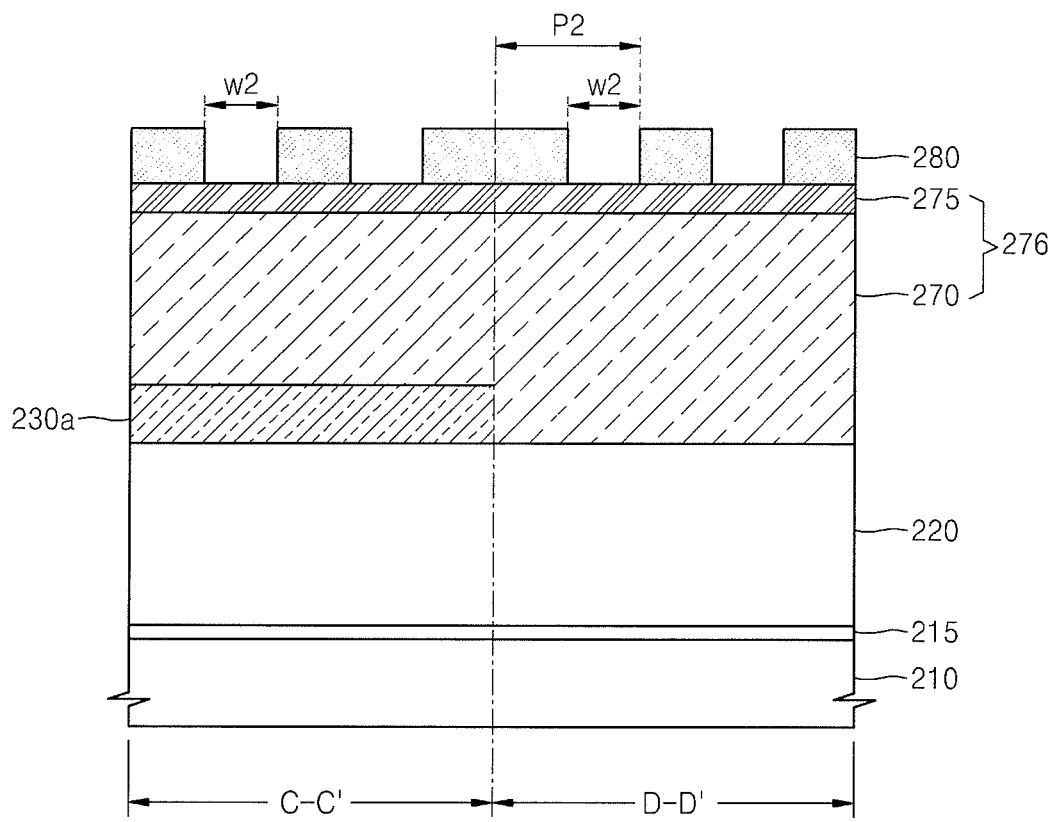

FIGS. 16A, 16B, and 16C are plane and cross-sectional views illustrating forming a second hardmask 276 and a second photoresist pattern 280, according to a comparative example of the inventive concept. Referring to FIGS. 16A to 16C, a third material layer 270 is formed on the target layer 220 and the first material layer pattern 230a. The third material layer 270 is formed to cover both the target layer 220 and the first material layer pattern 230a. A fourth material layer 275 may be additionally formed on the third material layer 270. The third material layer 270 together with the fourth material layer 275 may be referred to as the second hardmask 276. The second photoresist pattern 280 is formed on the fourth material layer 275.

The third material layer 270, the fourth material layer 275, the second hardmask 276, and the second photoresist pattern 280 are respectively similar to the third material layer 170, the fourth material layer 175, the second hardmask 176, and the second photoresist pattern 180 described above with reference to FIGS. 5A to 5C, and thus, their description will not be described again here.

Figure 17A:
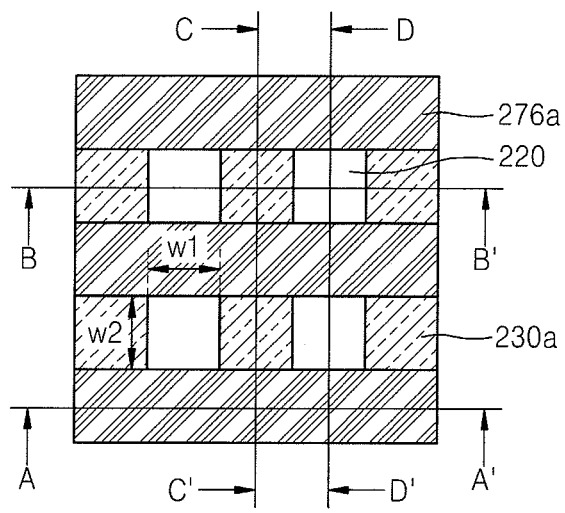
Figure 17B:
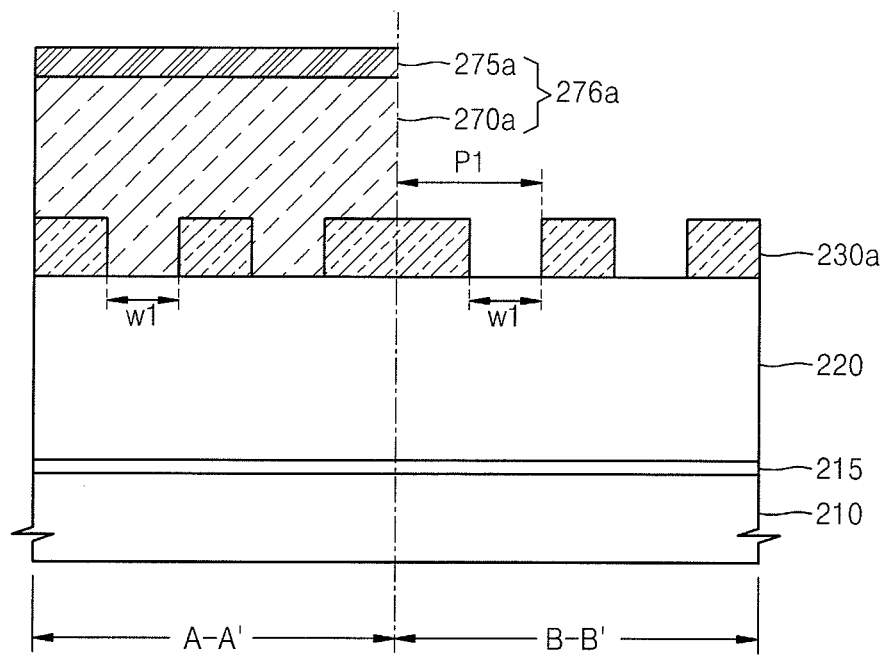
Figure 17C:
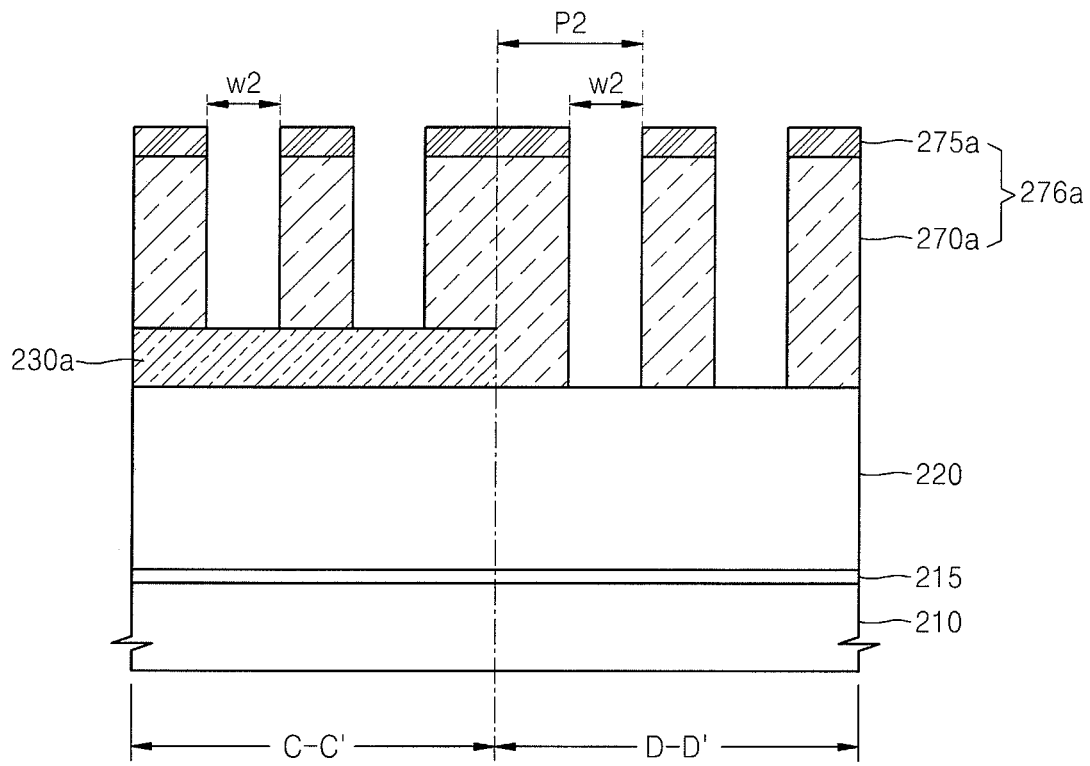

FIGS. 17A, 17B, and 17C are plane and cross-sectional views illustrating forming the second hardmask pattern 276a, according to a comparative example of the inventive concept. Referring to FIGS. 17A to 17C, the second hardmask 276 is etched using the second photoresist pattern 280 as an etch mask so as to form the second hardmask pattern 276a that includes a plurality of patterns extending in the second direction on the first material layer pattern 230a and the target layer 220. The second hardmask pattern 276a may include a stack of a third material layer pattern 270a and a fourth material layer pattern 275a, or the third material layer pattern 270a alone.

The third material layer pattern 270a, the fourth material layer pattern 275a, and the second hardmask pattern 276a are respectively the same as the third material layer pattern 170a, the fourth material layer pattern 175a, and the plurality of second hardmask patterns 176a described above with reference to FIGS. 6A to 6C, and thus, their description will not be described again here.

Figure 18A:
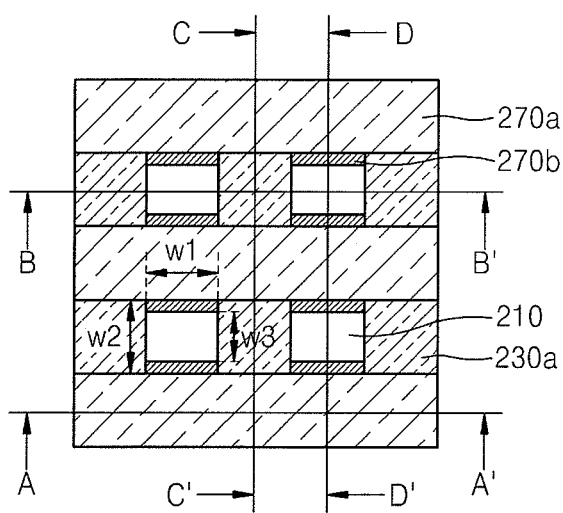
Figure 18B:
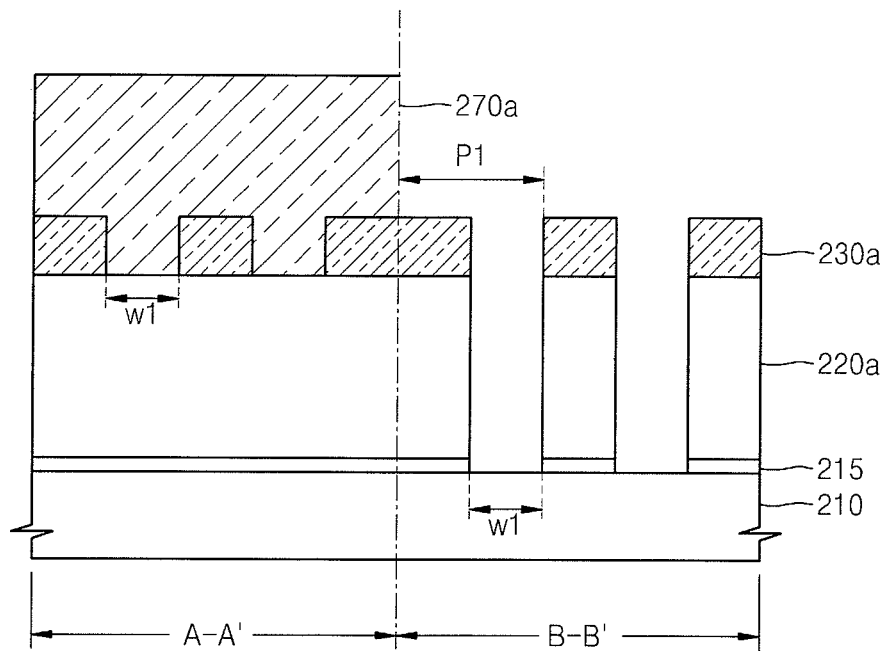
Figure 18C:
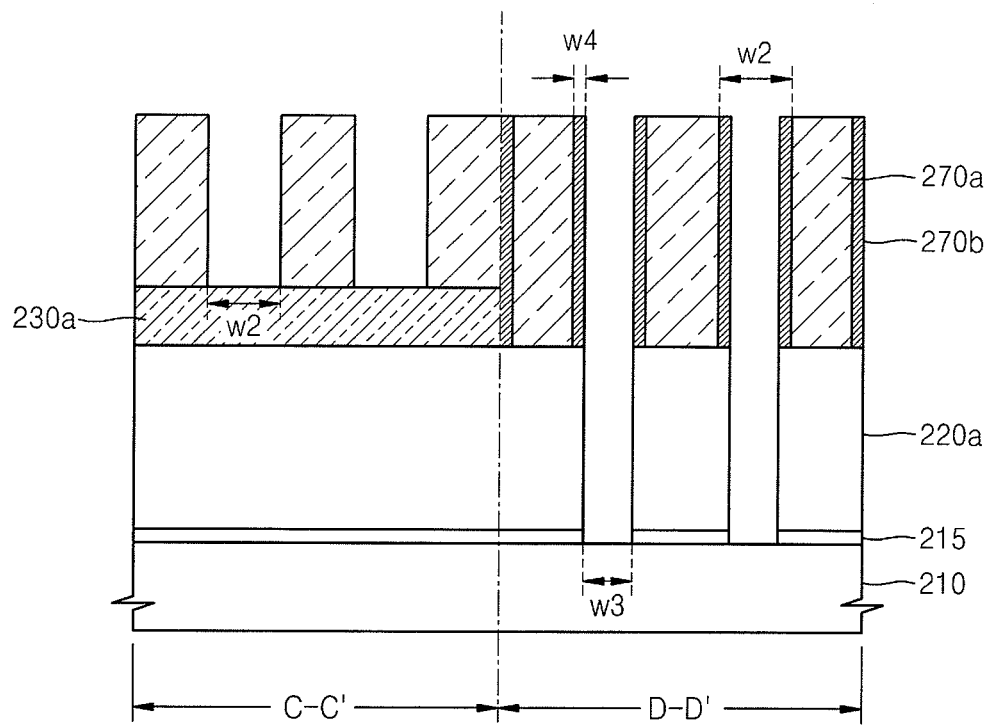

FIGS. 18A, 18B, and 18C are plane and cross-sectional views illustrating forming a target layer pattern 220a, according to a comparative example of the inventive concept. Referring to FIGS. 18A to 18C, the target layer pattern 220a is formed by etching the target layer 220 by using the second hardmask pattern 276a and the first material layer pattern 230a as etch masks. If the target layer 220 includes an oxide, the target layer 220 may be etched using an etch gas containing a fluorocarbon ($C_xF_y$) gas. However, if the third material layer pattern 270a including a carbon-containing layer, such as an SOH, is used as a part of the etch mask during the etching of the target layer 220, then a carbon-containing polymer 270b may be formed on the third material layer pattern 270a. The carbon-containing polymer 270b may cause the dimensions of a plurality of holes, which are to be formed in the target layer pattern 220a, to be reduced.

Specifically, in some embodiments, during the etching of the target layer 220, the first material layer pattern 230a is used as an etch mask, taken along the line B-B', and thus, in this case a polymer is minimally formed on side surfaces of the first material layer pattern 230a, thereby preventing the dimensions of a plurality of holes, which are to be formed in the target layer pattern 220a, from being reduced. Thus, the target layer pattern 220a includes a plurality of patterns that extend in the second direction and are spaced apart from each other at a predetermined interval w1 and that each have a first predetermined pitch P1, taken along the line B-B'.

On the other hand, in another example embodiment, during the etching of the target layer 220, the second hardmask pattern 276a is used as an etch mask, taken along the line D-D', and thus, the carbon-containing polymer 270b is formed on side surfaces of the first material layer pattern 276a and particularly, on side surfaces of the third material layer pattern 270a, thereby reducing the dimensions of a plurality of holes, which are to be formed in the target layer pattern 220a, from w2 to w3. Assuming the width of the carbon-containing polymer 270b to be w4, then w3=w2−(w4×2). The target layer pattern 220a includes a plurality of patterns that extend in the first direction and are apart from each other at a predetermined interval w3, taken along the line D-D'.

Figure 19A:
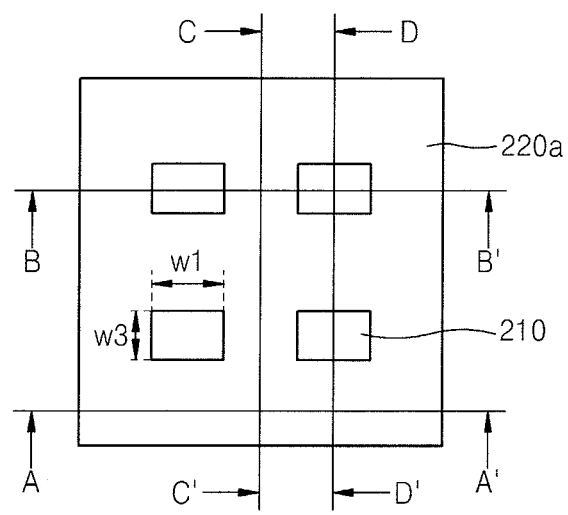
Figure 19B:
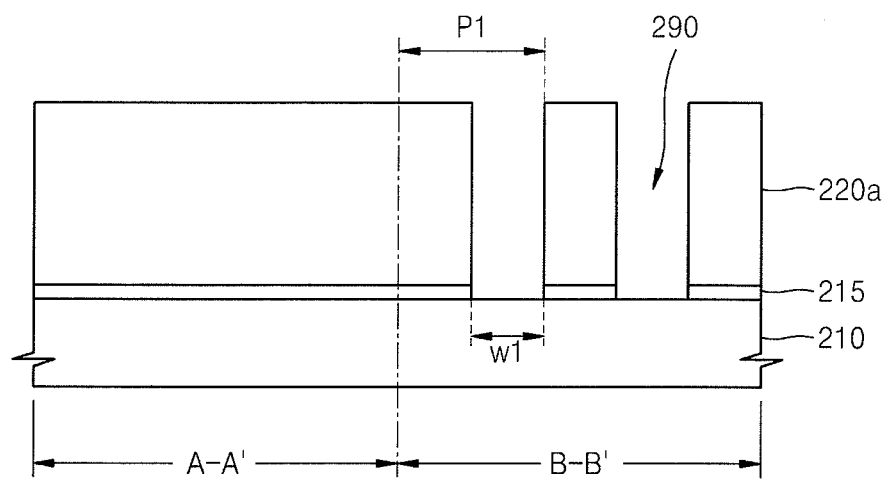
Figure 19C:
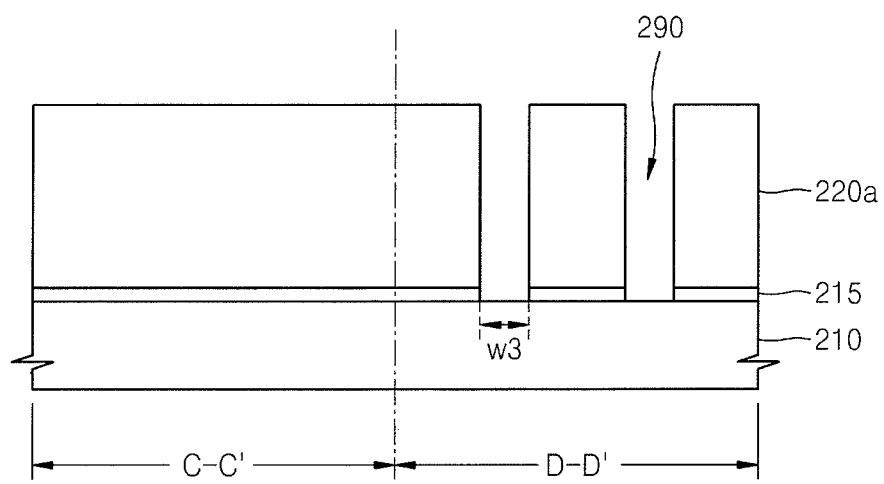

FIGS. 19A, 19B, and 19C are plane and cross-sectional views further illustrating forming the target layer pattern 220a, according to a comparative example of the inventive concept. Referring to FIGS. 19A to 19C, the third material layer pattern 270a, the carbon-containing polymer 270b, and the first material layer pattern 230a are removed to completely expose an upper surface of the target layer pattern 220a.

The width of each of a plurality of holes 290 formed in the target layer pattern 220a is w1, taken along the line B-B', and the width is w3, that is less than w2, taken along the line D-D'. In this case, a region of each of the plurality of holes 290 that is suitable contacts an element formed below the plurality of holes 290 is small. Thus, the plurality of holes 290 may be smaller than designed, thereby preventing the semiconductor device from normally operating. For example, if the plurality of holes 290 in the target layer pattern 220a are filled with a conductive material to form a conductive plug and the conductive plug is connected to an active region of the substrate 210, then electrical resistance of the semiconductor device may increase when the resulting plurality of holes 290 are smaller than originally intended or designed.

FIGS. 20A to 20D are cross-sectional views illustrating a target layer pattern 120a having a plurality of holes 190 and a substrate 110, according to various embodiments of the inventive concept. Specifically, FIGS. 20A to 20D are enlarged cross-sectional views illustrating a region B of FIG. 11B or a region D of FIG. 11C, according to various embodiments of the inventive concept.

Figure 20A:
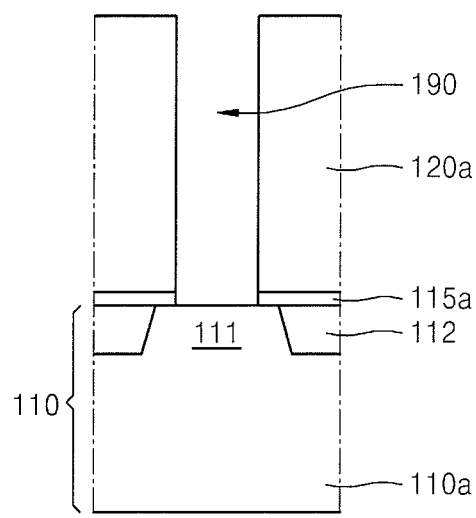
FIGS. 20A to 20D are cross-sectional views illustrating a target layer pattern having at least one hole and a substrate, according to various embodiments of the inventive concept.

FIG. 20A is a cross-sectional view illustrating the target layer pattern 120a having at least one hole 190 and a substrate 110, according to an embodiment of the inventive concept. Referring to FIG. 20A, the substrate 110 may include a base material layer 110a, and an isolation layer 112 that defines an active region 111. The at least one hole 190 may be formed to correspond to the active region 111 so as to expose the active region 111. The active region 111 and the isolation layer 112 may be formed before the target layer pattern 120a or an etch stop layer pattern 115a are formed.

In some embodiments, the base material layer 110a may include a semiconductor material, e.g., a Group IV semiconductor, a Group III-V compound semiconductor, or a Group II-VI oxide semiconductor. For example, the Group IV semiconductor may be silicon, germanium, or silicon-germanium. Otherwise, the base material layer 110a may be a Silicon-On Insulator (SOI) substrate, a gallium-arsenic substrate, a silicon-germanium substrate, a ceramic substrate, a quartz substrate, or a glass substrate for a display device.

Figure 20B:
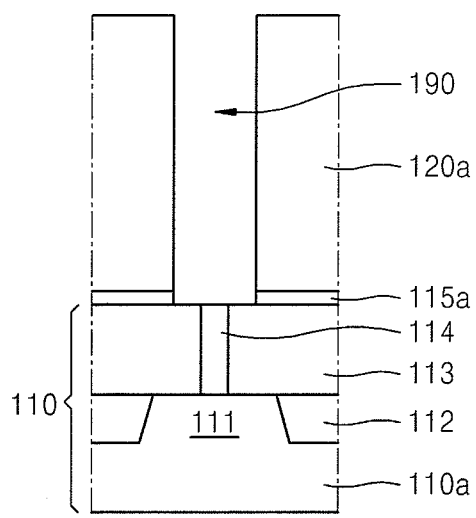

FIG. 20B is a cross-sectional view illustrating a target layer pattern 120a having at least one hole 190 and a substrate 110, according to another embodiment of the inventive concept. Referring to FIG. 20B, the substrate 110 may include a base material layer 110a in which an isolation layer 112 is formed to define an active region 111, and an insulating interlayer 113 formed on the base material layer 110a. A contact plug 114 may be formed in the insulating interlayer 113 to pass through the insulating interlayer 113. The contact plug 114 may be formed to be electrically connected to the active region 111.

The at least one hole 190 may be formed to correspond to the contact plug 114 to expose an upper surface of the contact plug 114. A material (not shown) to be applied inside the at least one hole 190 may be electrically connected to the active region 111 via the contact plug 114.

Figure 20C:
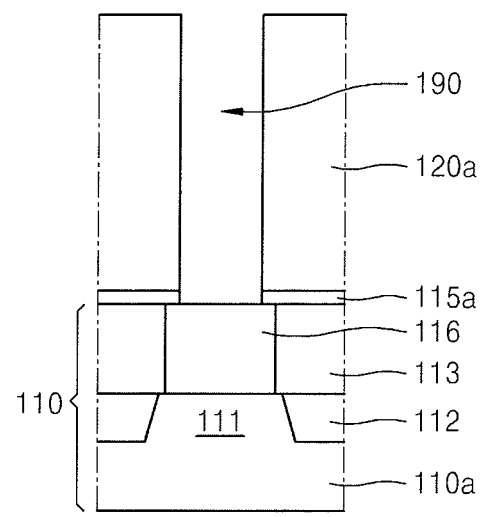

FIG. 20C is a cross-sectional view illustrating a target layer pattern 120a having at least one hole 190 and a substrate 110, according to another embodiment of the inventive concept. Referring to FIG. 20C, the substrate 110 may include a base material layer 110a in which an isolation layer 112 is formed to define an active region 111, and an insulating interlayer 113 formed on the base material layer 110a. A contact plug 116 may be formed in the insulating interlayer 113 to pass through the insulating interlayer 113. The contact plug 116 may be formed in the insulating interlayer 113 to be electrically connected to the active region 111.

In some embodiments, a horizontal cut end of the contact plug 114 of FIG. 20B and a horizontal cut end of the contact plug 116 of FIG. 20C may have different areas with respect to the substrate 110. In other words, the upper surface of the contact plug 114 of FIG. 20B may be completely exposed by the at least one hole 190 but only a part of an upper surface of the contact plug 116 of FIG. 20C may be exposed by the at least one hole 190.

Figure 20D:
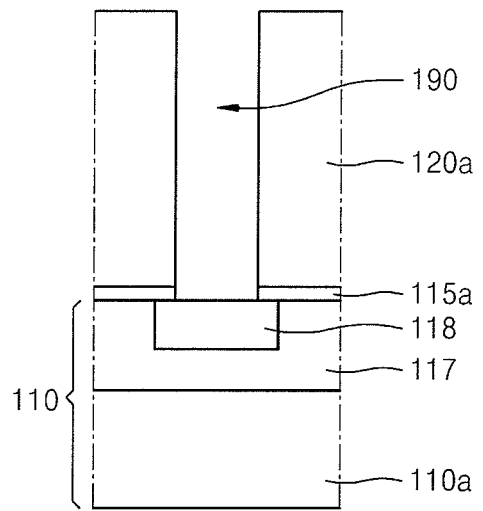

FIG. 20D is a cross-sectional view illustrating a target layer pattern 120a having at least one hole 190 and a substrate 110, according to another embodiment of the inventive concept. Referring to FIG. 20D, the substrate 110 may include a base material layer 110a and an insulating interlayer 117. A conductive line 118 may be formed partially in the insulating interlayer 117. A portion of the conductive line 118 may be exposed by the at least one hole 190. A material (not shown) to be applied inside the at least one hole 190 may be electrically connected to the conductive line 118.

The substrates 110 illustrated in FIGS. 20A to 20D may be selectively used in various embodiments of the inventive concept.

Figure 21A:
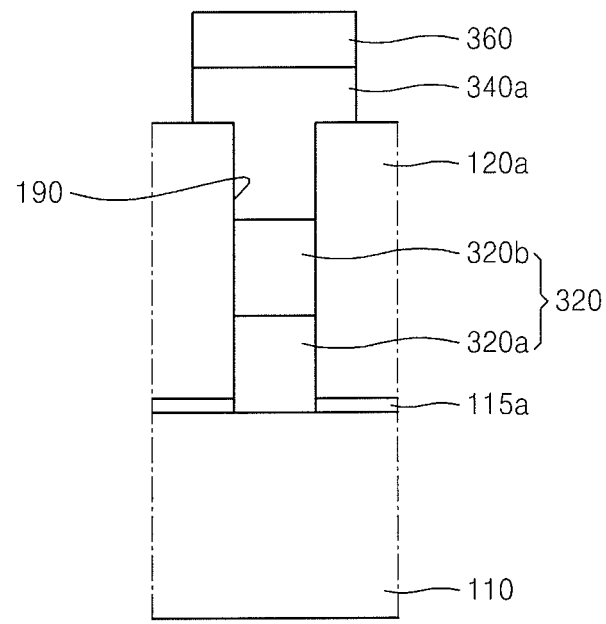
FIGS. 21A to 21C are cross-sectional views illustrating a phase-change memory cell according to various embodiments of the inventive concept.
Figure 21B:
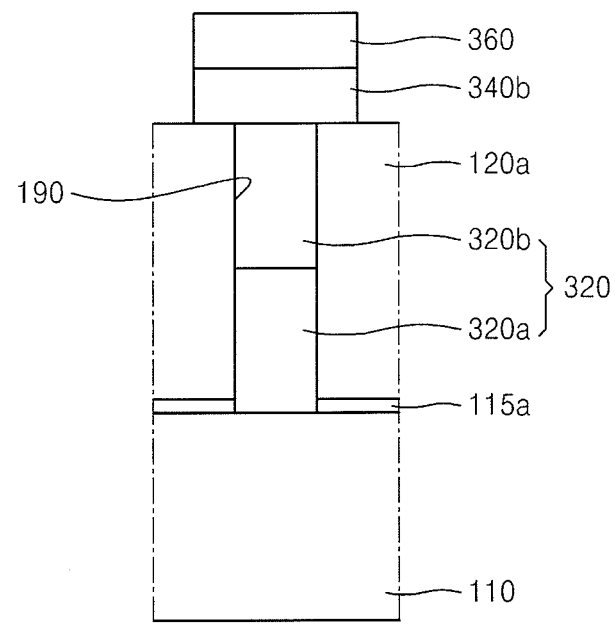
Figure 21C:
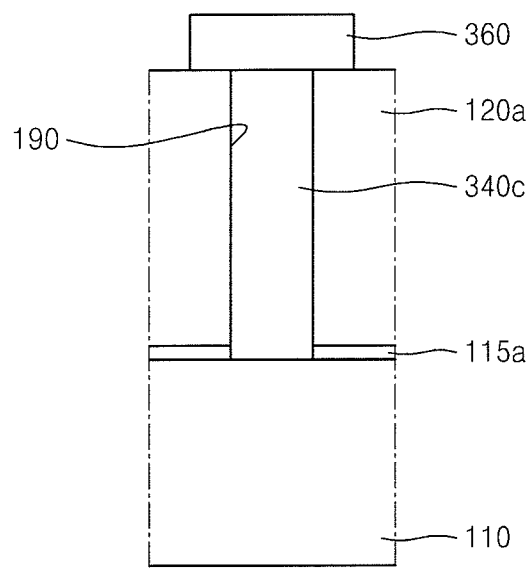

FIGS. 21A to 21C are cross-sectional views illustrating a phase-change memory cell according to various embodiments of the inventive concept. Specifically, FIGS. 21A to 21C are enlarged cross-sectional views illustrating the region B of FIG. 11B or the region D of FIG. 11C, according to various embodiments of the inventive concept.

FIG. 21A is a cross-sectional view illustrating a phase-change memory cell according to an embodiment of the inventive concept. Referring to FIG. 21A, a first semiconductor material plug 320a of a first conductive type, and a second semiconductor material plug 320b of a second conductive type that is different from the first conductive type are formed inside at least one hole 190 in a target layer pattern 120a. The first and second semiconductor material plugs 320a and 320b may be formed to partially fill the at least one hole 190. The first and second semiconductor material plugs 320a and 320b may together form a diode 320 in which current flows only in one direction.

Then, a phase-change material layer 340a is formed on the diode 320 to completely fill the at least one hole 190. The phase-change material layer 340a may be formed only in the at least one hole 190 or may be formed in the at least one hole 190 and on the target layer pattern 120a. Thus, the phase-change material layer 340a may be formed on the second semiconductor material plug 320b. An electrode layer 360 may be formed on the phase-change material layer 340a. The phase-change material layer 340a and the electrode layer 360 may be formed by forming a preliminary phase-change material layer (not shown) and a preliminary electrode layer (not shown), and partially removing the preliminary phase-change material layer and the preliminary electrode layer in such a manner that the phase-change material layer 340a may be correspond to the at least one hole 190.

Thus, the phase-change material layer 340a between the diode 320 and the electrode layer 360 may operate as a phase-change memory cell.

FIG. 21B is a cross-sectional view illustrating a phase-change memory cell according to another embodiment of the inventive concept. Referring to FIG. 21B, a first semiconductor material plug 320a of a first conductive type, and a second semiconductor material plug 320b of a second conductive type that is different from the first conductive type are formed inside at least one hole 190 in a target layer pattern 120a. The first and second semiconductor material plugs 320a and 320b may be formed to completely fill the at least one hole 190. The first and second semiconductor material plugs 320a and 320b may together form a diode 320 in which current flows only in one direction.

Then, a phase-change material layer 340b is formed on the diode 320 and the target layer pattern 210a. An electrode layer 360 may be formed on the phase-change material layer 340b. In this embodiment, the area of the phase-change material layer 340b may be greater than that of a horizontal cut of the at least one hole 190.

Thus, the phase-change material layer 340b between the diode 320 and the electrode layer 360 may act as a phase-change memory cell.

FIG. 21C is a cross-sectional view illustrating a phase-change memory cell according to another embodiment of the inventive concept. Referring to FIG. 21C, a phase-change material layer 340c is formed in at least one hole 190 in a target layer pattern 120a. An electrode layer 360 may be formed on the phase-change material layer 340c. The at least one hole 190 may be completely filled with the phase-change material layer 340c. Alternatively, although not shown, a part of the at least one hole 190 may be filled with the phase-change material layer 340c and the remaining part of the at least one hole 190 may be filled with the electrode layer 360.

Thus, the phase-change material layer 340c between a diode 110 and the electrode layer 360 may operate as a phase-change memory cell.

Figure 22:
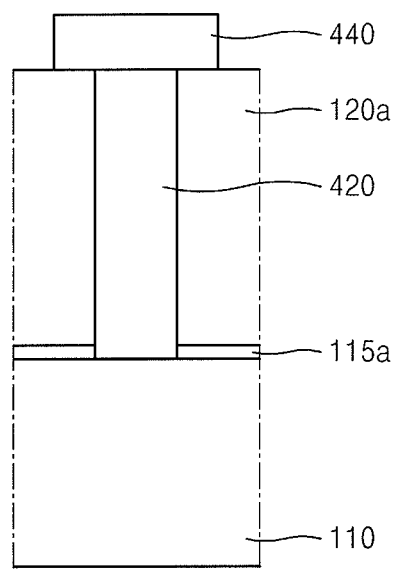
FIG. 22 is a cross-sectional view illustrating forming a conductive plug, according to an embodiment of the inventive concept.

FIG. 22 is a cross-sectional view illustrating forming a conductive plug 420, according to an embodiment of the inventive concept. Referring to FIG. 22, the conductive plug 420 is formed by applying a conductive material inside at least one hole in a target layer pattern 120a. A conductive line 440 may be formed on the conductive plug 420 to be electrically connected to the conductive plug 420.

FIGS. 23 to 25C are cross-sectional views illustrating forming a capacitor, according to various embodiments of the inventive concept.

Figure 23:
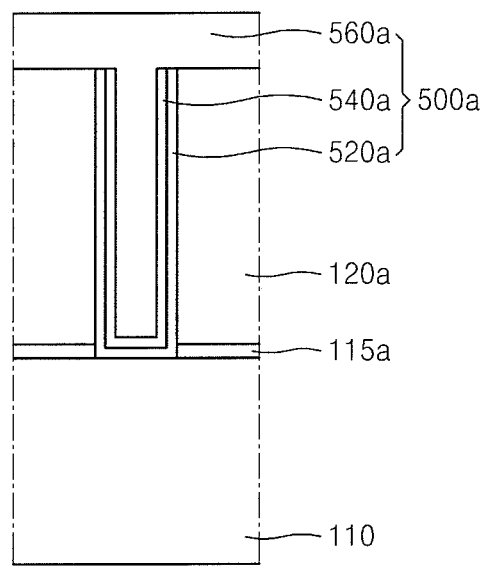
FIGS. 23 to 25C are cross-sectional views illustrating forming a capacitor, according to various embodiments of the inventive concept.

FIG. 23 is a cross-sectional view illustrating forming a capacitor 500a, according to an embodiment of the inventive concept. Referring to FIG. 23, a lower electrode layer 520a and a capacitor dielectric layer 540a are formed to conformally cover inner side walls of and a bottom of at least one hole 190 in a target layer pattern 120a. The lower electrode layer 520a and the capacitor dielectric layer 540a may be formed to partially fill the at least one hole 190. The lower electrode layer 520a and the capacitor dielectric layer 540a may be formed by forming a preliminary lower electrode layer (not shown) and a preliminary capacitor dielectric layer (not shown) to cover both inner surfaces of the at least one hole 190 and an upper surface of the target layer pattern 120a, completely filling the at least one hole 190 with a molding material (not shown), and performing an etch back process or chemical mechanical polishing (CMP) on the resultant structure. Then, the capacitor 500a may be obtained by forming an upper electrode layer 560a to completely, or at least partially, fill the remaining portion at least one hole 190.

Figure 24A:
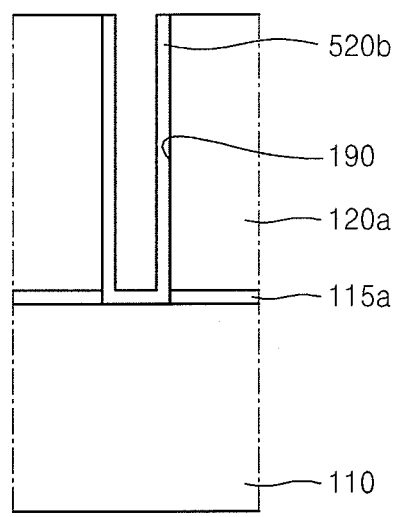
Figure 24B:
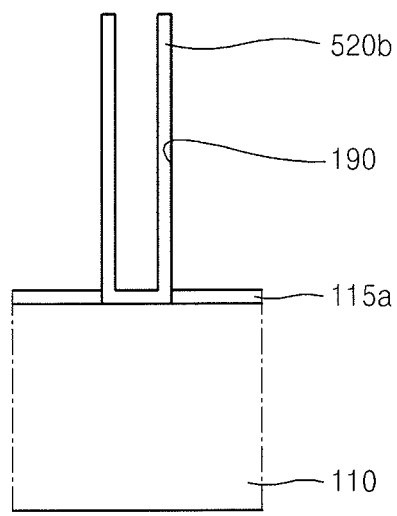
Figure 24C:
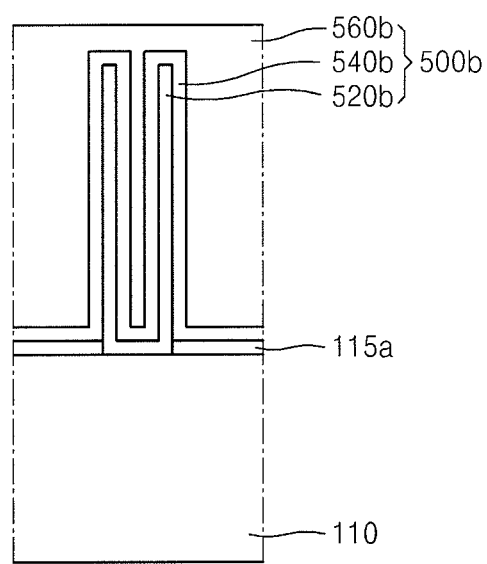

FIGS. 24A to 24C are cross-sectional views sequentially illustrating a method of forming a capacitor 500b, according to another embodiment of the inventive concept. Referring to FIG. 24A, a lower electrode layer 520b is formed covering inner side walls of and a bottom of at least one hole 190 in a target layer pattern 120a. The lower electrode layer 520b may be formed to partially fill the at least one hole 190.

Referring to FIG. 24B, the target layer pattern 120a is removed in such a manner that the lower electrode layer 520b remains. Thus, the lower electrode layer 520b may have a hollow pillar shape, e.g., a cylindrical shape or a rectangular pipe shape.

Referring to FIG. 24C, the capacitor 500b may be obtained by forming a capacitor dielectric layer 540b on a substrate 110 to completely, and conformally, cover an exposed surface of the lower electrode layer 520b, and forming an upper electrode layer 560b on the capacitor dielectric layer 540b.

Figure 25A:
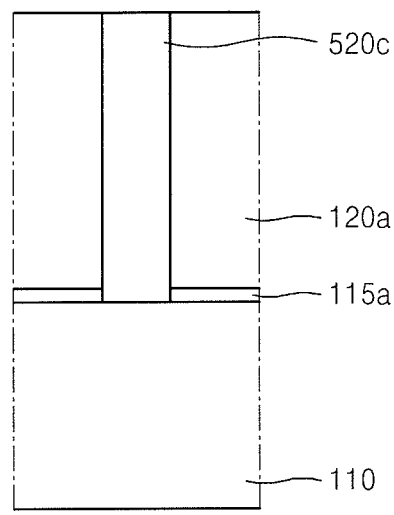
Figure 25B:
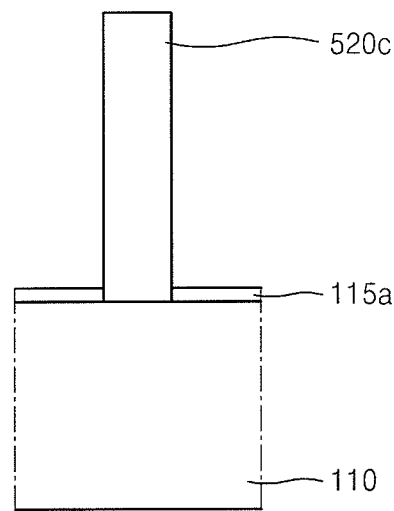
Figure 25C:
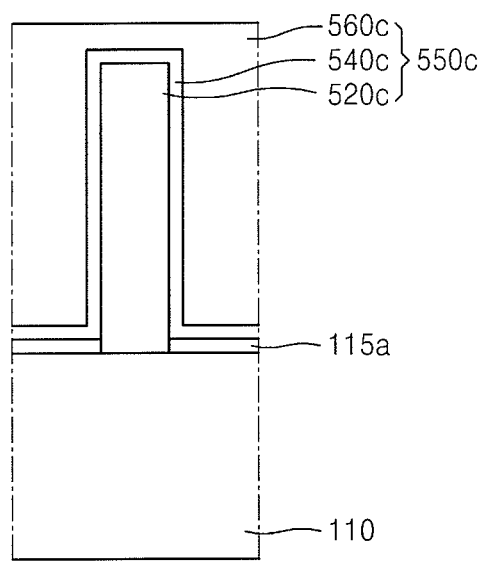

FIGS. 25A to 25C are cross-sectional views sequentially illustrating a method of forming a capacitor 550C, according to another embodiment of the inventive concept. Referring to FIG. 25A, a lower electrode layer 520c is formed to fill at least one hole (not shown) in a target layer pattern 120a. Alternatively, the lower electrode layer 520c may be formed to completely fill the at least one hole 190.

Referring to FIG. 25B, the target layer pattern 120a is removed in such a manner that the lower electrode layer 520c remains. Thus, the lower electrode layer 520c may have a pillar shape.

Referring to FIG. 25C, the capacitor 550C may be obtained by conformally forming a capacitor dielectric layer 540c on a substrate 110 to completely cover an exposed surface of the lower electrode layer 520c, and forming an upper electrode layer 560c on the capacitor dielectric layer 540c.

As described above with reference to FIGS. 21A to 25C, the at least one hole 190 illustrated in one of FIGS. 21A to 25C may be used to manufacture a capacitor, a phase-change memory cell, a conductive plug, or other suitable structures or elements of structures, and various types of semiconductor devices or various types of semiconductor memory devices may be fabricated by using a selective combination of the substrates 110 illustrated in FIGS. 20A to 20D.

While the inventive concepts have been particularly shown and described with reference to exemplary embodiments thereof, it will be understood that various changes in form and details may be made therein without departing from the spirit and scope of the following claims.

What is claimed is:

1. A method of fabricating a semiconductor device, the method comprising:
sequentially forming a target layer and a first material layer on a substrate, the first material layer directly on the target layer;
forming a plurality of second material layer patterns directly on the first material layer, the second material layer patterns extending in a first horizontal direction;
forming a plurality of hardmask patterns extending in a second horizontal direction, on the plurality of second material layer patterns and the first material layer, wherein the second horizontal direction is different from the first horizontal direction;
forming a first material layer pattern and exposing portions of the target layer by etching the first material layer using the plurality of hardmask patterns extending in the second horizontal direction and the plurality of second material layer patterns extending in the first horizontal direction as etch masks; and
forming a target layer pattern with a plurality of holes by etching the target layer using the first material layer pattern as an etch mask,
wherein the plurality of second material layer patterns and the plurality of hard mask patterns are line patterns, respectively.

2. The method of claim 1, before the forming of the target layer pattern, further comprising removing the plurality of hardmask patterns.

3. The method of claim 1, wherein:
the plurality of hardmask patterns comprise a carbon-containing layer;
the first material layer comprises nitride; and
each of the plurality of second material layer patterns comprises an oxide.

4. The method of claim 3, wherein the plurality of hardmask patterns comprise a spin-on hardmask (SOH), and the first material layer comprises titanium nitride.

5. The method of claim 1, wherein the forming of the first material layer pattern comprises etching the first material layer using an etch gas containing a chlorine gas.

6. The method of claim 1, wherein the target layer comprises an oxide, and
the forming of the target layer pattern comprises etching the target layer by using an etch gas containing a fluorocarbon gas.

7. The method of claim 1, wherein the forming of the plurality of second material layer patterns comprises:
forming a second material layer directly on the first material layer;
forming a plurality of additional hardmask patterns extending in the first horizontal direction, on the second material layer; and
forming the plurality of second material layer patterns by etching the second material layer using the plurality of additional hardmask patterns as etch masks.

8. The method of claim 7, wherein the first material layer pattern is formed to correspond to locations on which either the plurality of hardmask patterns or the plurality of additional hardmask patterns are formed, and
the plurality of holes are formed to correspond to locations on which neither the plurality of hardmask patterns nor the plurality of additional hardmask patterns are formed.

9. The method of claim 1, wherein the first horizontal direction and the second horizontal direction are perpendicular to each other.

10. The method of claim 1, after the forming of the target layer pattern with the plurality of holes, further comprising filling the plurality of holes with a conductive material.

11. The method of claim 1, further comprising forming a plurality of active regions in the substrate, and
wherein at least one of the plurality of holes corresponds to each of the plurality of active regions.

12. The method of claim 11, after the forming of the target layer pattern with the plurality of holes, further comprising forming a conductive plug in the plurality of holes.

13. The method of claim 11, after the forming of the target layer pattern with the plurality of holes, further comprising:
forming a first semiconductor material plug of a first conductive type and a second semiconductor material plug of a second conductive type in the plurality of holes, respectively, wherein the second conductive type is different from the first conductive type; and
forming a phase-change material layer on the second semiconductor material plug.

14. The method of claim 1, after the forming of the target layer pattern with the plurality of holes, further comprising respectively forming at least one from among a lower electrode layer, a capacitor dielectric layer, and an upper electrode layer that form a capacitor together, in the plurality of holes.

15. A method of fabricating a semiconductor device, the method comprising:
sequentially forming a target layer, a titanium nitride layer, and an oxide layer on a substrate, the titanium nitride layer directly on the target layer;
forming a plurality of first hardmask patterns on the oxide layer, the plurality of first hardmask patterns extending in a first horizontal direction, spaced apart from each other, and each including a spin-on hardmark (SOH);
forming an oxide layer pattern by etching the oxide layer using the plurality of first hardmask patterns as etch masks;
forming a plurality of second hardmask patterns on the oxide layer pattern and the titanium nitride layer, the plurality of second hardmask patterns extending in a second horizontal direction that is different from the first horizontal direction, spaced apart from each other, and each including an SOH;
forming a titanium nitride layer pattern and exposing portions of the target layer by etching the titanium nitride layer by using the plurality of second hardmask patterns extending in the second horizontal direction and the oxide layer pattern extending in the first horizontal direction as etch masks, while preventing a carbon-containing polymer from being formed on the plurality of second hardmask patterns, by using an etch gas containing a chlorine gas; and
forming a target layer pattern with a plurality of holes by etching the target layer by using the titanium nitride layer pattern as an etch mask,
wherein the oxide layer pattern and the plurality of second hard mask patterns are line patterns, respectively.

16. A method of fabricating a semiconductor device, the method comprising:
forming a target layer on a substrate;
forming a first material layer directly on the target layer;
forming a plurality of second material layer patterns on the first material layer, the second material layer patterns extending in a first horizontal direction;

prior to etching the first material layer, forming a plurality of hardmask patterns extending in a second horizontal direction, on the plurality of second material layer patterns and the first material layer, wherein the second horizontal direction is different from the first horizontal direction;

after forming the plurality of second material layer patterns and the plurality of hardmask patterns, forming a first material layer pattern and exposing portions of the target layer by etching the first material layer using the plurality of hardmask patterns extending in the second direction and the plurality of second material layer patterns extending in the first direction as etch masks; and after forming the first material layer pattern, forming a target layer pattern with a plurality of holes by etching the target layer using the first material layer pattern as an etch mask, wherein the plurality of second material layer patterns and the plurality of hard mask patterns are line patterns, respectively.

17. The method of claim 16, wherein, before forming the target layer pattern, further comprising removing the plurality of hardmask patterns.

18. The method of claim 16, wherein, before forming the target layer pattern, further comprising removing the plurality of second material layer patterns.

19. The method of claim 16, wherein the plurality of hardmask patterns comprise a carbon-containing layer.

20. The method of claim 16, further comprising, following forming the target layer pattern, removing the first material layer pattern and applying a fill material to the plurality of holes.

\* \* \* \* \*